(12) United States Patent
Kang

(10) Patent No.: US 12,285,839 B2
(45) Date of Patent: Apr. 29, 2025

(54) CARRIER HEAD FOR CHEMICAL MECHANICAL POLISHING APPARATUS COMPRISING SUBSTRATE RECEIVING MEMBER

(71) Applicant: Joon Mo Kang, Seongnam (KR)

(72) Inventor: Joon Mo Kang, Seongnam (KR)

( * ) Notice: Subject to any disclaimer, the term of this patent is extended or adjusted under 35 U.S.C. 154(b) by 2013 days.

(21) Appl. No.: 16/080,002

(22) PCT Filed: Mar. 9, 2017

(86) PCT No.: PCT/KR2017/002606
§ 371 (c)(1),
(2) Date: Aug. 25, 2018

(87) PCT Pub. No.: WO2017/171262
PCT Pub. Date: Oct. 5, 2017

(65) Prior Publication Data
US 2019/0061098 A1    Feb. 28, 2019

(30) Foreign Application Priority Data

Apr. 1, 2016 (KR) .................. 10-2016-0039976

(51) Int. Cl.
*B24B 37/27* (2012.01)
*B24B 37/00* (2012.01)
(Continued)

(52) U.S. Cl.
CPC .............. *B24B 37/27* (2013.01); *B24B 37/00* (2013.01); *B24B 37/30* (2013.01); *B24B 41/002* (2013.01);
(Continued)

(58) Field of Classification Search
CPC . H01L 21/67; H01L 21/673; H01L 21/67309; H01L 21/67126; B24B 37/30; B24B 37/32
(Continued)

(56) References Cited

U.S. PATENT DOCUMENTS 5,738,574 A * 4/1998 Tolles ................... B24B 53/017
451/247
6,162,116 A * 12/2000 Zuniga ................... B24B 37/32
451/288

(Continued)

FOREIGN PATENT DOCUMENTS

JP     2004-501779 A    1/2004
JP     2013-111679 A    6/2013
(Continued)

OTHER PUBLICATIONS

Cambridge Advanced Learner's Dictionary and Thesaurus Definition of "Extend".*

*Primary Examiner* — Brian D Keller
*Assistant Examiner* — Jason Khalil Hawkins
(74) *Attorney, Agent, or Firm* — NKL Law; Jae Youn Kim

(57) ABSTRACT

A carrier head for a chemical mechanical polishing apparatus comprises: a base; a substrate receiving member comprising a plate portion having an outer surface for receiving a substrate and an inner surface at the back of the outer surface, a perimeter portion extended in a height direction from an edge of the plate portion, a securing portion extended from an outer part of the perimeter portion and connected to a lower part of the base, and a contact portion extended from an inner part of the perimeter portion; a contact coupling structure connected to the lower part of the base to provide a contact surface to the contact portion; and a perimeter portion pressurizing chamber formed by taking (Continued)

the securing portion and the contact portion as chamber walls when the contact portion contacts firmly the contact coupling structure by means of fluid pressure.

22 Claims, 19 Drawing Sheets

(51) Int. Cl.
- *B24B 37/30* (2012.01)
- *B24B 41/00* (2006.01)
- *H01L 21/304* (2006.01)
- *H01L 21/306* (2006.01)
- *H01L 21/463* (2006.01)
- *H01L 21/465* (2006.01)
- *H01L 21/67* (2006.01)
- *H01L 21/673* (2006.01)

(52) U.S. Cl.
CPC ........ *H01L 21/3043* (2013.01); *H01L 21/306* (2013.01); *H01L 21/463* (2013.01); *H01L 21/465* (2013.01); *H01L 21/67* (2013.01); *H01L 21/673* (2013.01); *H01L 21/67309* (2013.01); *H01L 21/67126* (2013.01)

(58) Field of Classification Search
USPC .................................. 451/288, 397, 398, 287
See application file for complete search history.

(56) References Cited

U.S. PATENT DOCUMENTS

| | | | |
|---|---|---|---|
| 6,241,593 B1 * | 6/2001 | Chen | B24B 37/30 451/288 |
| 6,277,014 B1 * | 8/2001 | Chen | B24B 37/32 451/287 |
| 6,361,419 B1 * | 3/2002 | Zuniga | B24B 37/30 451/287 |
| 6,390,905 B1 * | 5/2002 | Korovin | B24B 37/30 451/286 |
| 6,450,868 B1 * | 9/2002 | Zuniga | B24B 37/30 451/388 |
| 6,857,945 B1 | 2/2005 | Chen et al. | |
| 7,083,507 B2 | 8/2006 | Togawa et al. | |
| 7,198,561 B2 | 4/2007 | Chen et al. | |
| 7,303,466 B2 * | 12/2007 | Boo | B24B 37/30 451/288 |
| 8,357,029 B2 | 1/2013 | Fukushima et al. | |
| 8,485,866 B2 | 7/2013 | Yasuda et al. | |
| 8,939,817 B2 * | 1/2015 | Son | B24B 41/061 451/288 |
| 11,179,823 B2 * | 11/2021 | Nabeya | B24B 37/32 |
| 2003/0181153 A1 * | 9/2003 | Chen | B24B 37/30 451/288 |
| 2008/0187430 A1 * | 8/2008 | Datta | H01L 21/67126 29/402.02 |
| 2013/0260654 A1 * | 10/2013 | Kang | B24B 37/30 451/398 |
| 2018/0117730 A1 * | 5/2018 | Nabeya | B24B 37/32 |

FOREIGN PATENT DOCUMENTS

| | | |
|---|---|---|
| KR | 10-2003-0045269 A | 6/2003 |
| KR | 10-0897226 B1 | 5/2009 |
| KR | 10-2012-0021190 A | 3/2012 |
| KR | 10-2013-0111981 A | 10/2013 |
| KR | 10-2014-0067325 A | 6/2014 |
| KR | 10-2014-0125289 A | 10/2014 |
| KR | 10-1589445 B1 | 1/2016 |

* cited by examiner

CARRIER HEAD FOR CHEMICAL MECHANICAL POLISHING APPARATUS COMPRISING SUBSTRATE RECEIVING MEMBER

TECHNICAL FIELD

The present invention relates to a chemical mechanical polishing apparatus, and more particularly, to a carrier head comprising a substrate receiving member for applying polishing pressure to a substrate during a polishing process.

BACKGROUND ART

When manufacturing semiconductor or glass substrates, and fabricating integrated circuits, a need to polish or planarize the surface of a substrate at particular steps has been increased. As a technology to satisfy the need, a chemical mechanical polishing (CMP) has been widely used.

In general, the CMP of a substrate is performed by attaching a polishing pad on a platen, mounting the substrate to a substrate receiving unit called a carrier head, and then, while applying slurry to the polishing pad, rotating the platen and carrier head simultaneously to generate friction between the polishing pad and the substrate.

Basically, the carrier head comprises a base receiving motive power from a drive shaft and providing space in which carrier parts are capable of being fixed, a substrate receiving member connected to a lower part of the base to receive and rotate the substrate, and a retaining ring supporting a side surface of the substrate during the polishing process to prevent the substrate from slipping out from the beneath of the carrier head. During polishing, the substrate is applied with polishing pressure through the substrate receiving member, and accordingly, polishing uniformity of the substrate depends greatly upon the structure of the substrate receiving member. Particularly, it is hard to obtain good polishing uniformity on the edge peripheral and adjacent areas of the substrate due to discontinuous characteristics of the edge periphery of the substrate, and therefore, there is a need to precisely control the pressure on these areas.

FIG. 1 is a schematic cross-sectional view showing a conventional carrier head (which is disclosed in U.S. Pat. No. 6,857,945). The carrier head comprises base assemblies 10, 40, and 42, a membrane 30 for receiving and applying pressure to a substrate 50, and a retaining ring 20. In this case, a perimeter portion 32 of the membrane 30 applies pressure to the edge periphery of the substrate 50, and to do this, a fluid pressure is applied to an outermost chamber C1 to press the perimeter portion 32 toward the substrate 50. At this time, thick rim portions 33' and 34' of a first outer flap 33 and a second outer flap 34 are fixed to the base 10 by means of clamps 40 and 42, and the outermost chamber C1 is sealed to allow the fluid pressure in the outermost chamber C1 to be kept. Like this, in case where all the flaps forming a chamber for applying pressure to the perimeter portion are to be fixed, there need space occupied by the clamps to fix the flaps, and also space necessary for fixing work. Accordingly, there is a restriction in reducing the size or changing the shape of the chamber in order to apply pressure the perimeter portion vertically.

DISCLOSURE

Technical Problem

The present invention has been made in view of the above-mentioned problems occurring in the prior art, and it is an object of the present invention to provide a carrier head comprising a substrate receiving member for a chemical mechanical polishing apparatus that is capable of precisely applying pressure to an edge peripheral area of a substrate and an area adjacent thereto during a chemical mechanical polishing.

Technical Solution

In one aspect, the invention to achieve above-mentioned object is directed to a carrier head for a chemical mechanical polishing apparatus comprising a substrate receiving member. The carrier head comprises: a base; a substrate receiving member comprising a plate portion having an outer surface for receiving a substrate and an inner surface at the back of the outer surface, a perimeter portion extended in a height direction from an edge of the plate portion, a securing portion extended from an outer part of the perimeter portion and connected to a lower part of the base, and a contact portion extended from an inner part of the perimeter portion; a contact coupling structure connected to the lower part of the base to provide a contact surface to the contact portion; and a perimeter portion pressurizing chamber formed by taking the securing portion and the contact portion as chamber walls when the contact portion contacts firmly the contact coupling structure by means of fluid pressure, wherein fluid in the perimeter portion pressurizing chamber is prevented from flowing to an inner side surface of the perimeter portion when fluid pressure in the perimeter portion pressurizing chamber is higher than fluid pressure acting on the inner side surface of perimeter portion, but fluid acting on the inner side surface of the perimeter portion is allowed to flow into the perimeter portion pressurizing chamber when fluid pressure acting on the inner side surface of the perimeter portion is higher than fluid pressure in the perimeter portion pressurizing chamber.

In another aspect of the present invention directed to a carrier head for a chemical mechanical polishing apparatus comprising a substrate receiving member, the carrier comprises: a base; a substrate receiving member comprising a plate portion having an outer surface for receiving a substrate and an inner surface at the back of the outer surface, a perimeter portion extended in a height direction from an edge of the plate portion, a securing portion extended from an outer part of the perimeter portion and connected to a lower part of the base, a contact portion extended from an inner part of the perimeter portion, and a protruding structure formed at a corner where the perimeter portion and the inner surface meet each other; a contact coupling structure connected to the lower part of the base to provide a contact surface to the contact portion; and a perimeter portion pressurizing chamber formed by taking the securing portion and the contact portion as chamber walls when the contact portion contacts firmly the contact coupling structure by means of fluid pressure, wherein fluid in the perimeter portion pressurizing chamber is prevented from flowing to an inner side surface of the perimeter portion when fluid pressure in the perimeter portion pressurizing chamber is higher than fluid pressure acting on the inner side surface of perimeter portion, but fluid acting on the inner side surface of the perimeter portion is allowed to flow into the perimeter portion pressurizing chamber when fluid pressure acting on the inner side surface of the perimeter portion is higher than fluid pressure in the perimeter portion pressurizing chamber.

In yet another aspect of the present invention directed to a substrate receiving member of a carrier head for a chemical mechanical polishing apparatus, the substrate receiving member comprises: a plate portion having an outer surface for receiving a substrate and an inner surface at the back of the outer surface; a perimeter portion extended in a height direction from an edge of the plate portion; a securing portion extended from an outer part of the perimeter portion; and a contact portion extended from an inner part of the perimeter portion.

In still yet another aspect of the present invention directed to a substrate receiving member of a carrier head for a chemical mechanical polishing apparatus, the substrate receiving member comprises: a plate portion having an outer surface for receiving a substrate and an inner surface at the back of the outer surface; a perimeter portion extended in a height direction from an edge of the plate portion; a securing portion extended from an outer part of the perimeter portion and connected to a lower part of the base; a contact portion extended from an inner part of the perimeter portion; and a protruding structure formed at a corner where the perimeter portion and the inner surface meet each other.

Advantageous Effects

According to the present invention, a carrier head for a chemical mechanical polishing apparatus comprising a substrate receiving member is capable of precisely applying pressure to an edge peripheral area of a substrate and an area adjacent thereto during a polishing process, thereby easily achieving polishing uniformity controls.

BEST MODE FOR INVENTION

Figure 1:
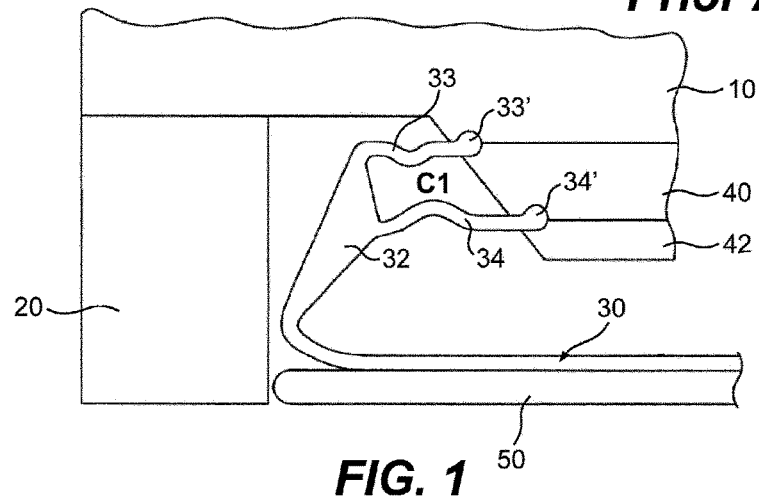
FIG. 1 is a schematic cross-sectional view showing a conventional carrier head.

Hereinafter, preferred embodiments of the present invention will be explained with reference to the attached drawings. However, the invention is not limited to the disclosed embodiments hereinafter, but will be embodied in various forms. Rather, these embodiments of the present invention are provided in order to fully explain the present invention to those skilled in the art. Therefore, in the drawings, the sizes of components may be exaggerated for the clarity and convenience of the description.

In the description, when it is said that one member is connected "to a lower part" of another member, it means that one member may be connected to another member by contacting "lower part" as well as other members may exist between the two members and one member may be connected to yet another member. On the contrary, when it is said that one member is connected "directly to a lower part", it means that another member may not exist between the two members. In the description, it should be noted that a same reference numeral in the drawings means a same component. Also, relative terms such as 'on' or 'up' and 'beneath' or 'down', as used herein are defined to describe the relationship of some components with other components as shown in the drawings. It should be understood that the relative terms include other directions of components inclusive of the directions as shown in the drawings. For example, if all components in the drawing are turned over, a component which located on another component becomes located beneath another component. Accordingly, for example, the term 'on' may include both of 'on' and 'beneath' depending on a specific direction of the drawings.

Figure 2:
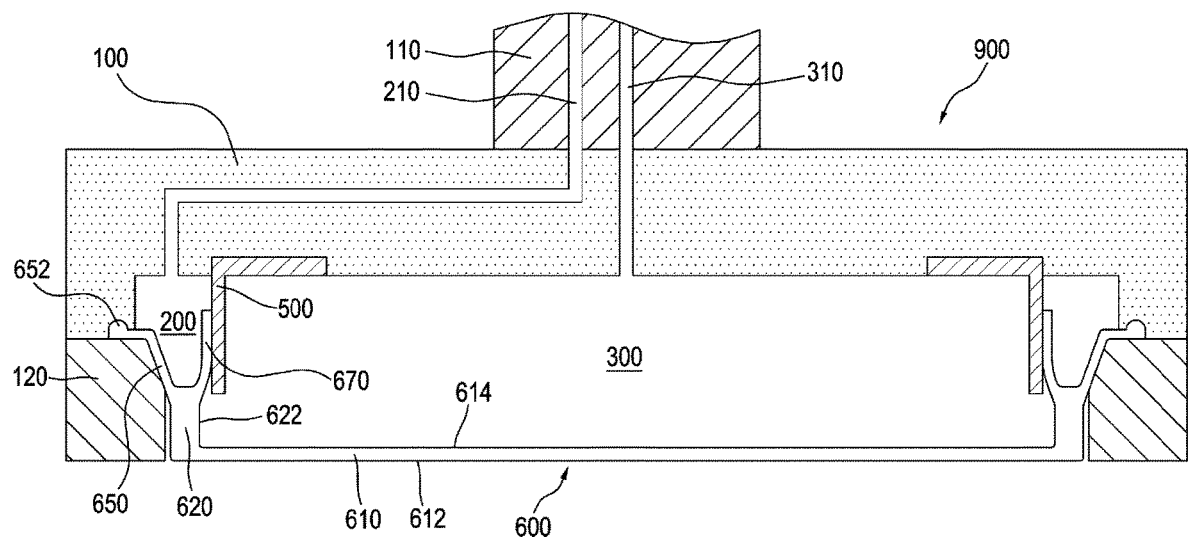
FIG. 2 is a cross-sectional view of a carrier head for a chemical mechanical polishing apparatus comprising a substrate receiving member according to an embodiment of the present invention.

FIG. 2 is a cross-sectional view of a carrier head 900 for a chemical mechanical polishing apparatus comprising a substrate receiving member 600 according to a preferred embodiment of the present invention. The carrier head 900 is built on a basis of a base 100 receiving motive power from a drive shaft 110. A retaining ring 120 is mounted to a lower part of the base 100 and serves to prevent a substrate (not shown) from slipping out during a polishing process. Inside of the retaining ring 120, a substrate receiving member 600 is connected to the lower part of the base 100.

The substrate receiving member 600 comprises a plate portion 610, a perimeter portion 620, a securing portion 650, and a contact portion 670. The plate portion 610 provides two surfaces defined as an outer surface 612 and an inner surface 614. The size and shape of the plate portion 610 conforms generally to the size and shape of a substrate (not shown) to be polished. For example, if a substrate is a 300 mm wafer, the plate portion 610 has a shape of a circle and can have a diameter of about 300 mm. The outer surface 612 is a substrate receiving surface against which a substrate is mounted and transferred. The inner surface 614, which is at the back of the outer surface 612, is a surface to which fluid pressure is applied.

The perimeter portion 620 is a portion extended in a height direction from an edge of the plate portion 610. Although the perimeter portion 620 is shown as perpendicular to the plate portion 610 in FIG. 2, the perimeter portion 620 is not necessarily to be perpendicular to the plate portion 610. It is sufficient for the perimeter portion 610 to be extended having a vertical component necessary for providing space for the connection thereof to the base 100.

The securing portion 650 is extended from an outer part of the perimeter portion 620 and connected to the lower part of the base 100, and desirably has a shape of a flap. The securing portion 650 can have an O-ring structure 652 at the end to provide a strong sealing. The contact portion 670 is a portion extended from an inner part of the perimeter portion 620 and configured to contact a contact coupling structure 500 connected to the lower part of the base 100. Unlike the securing portion 650, there is no need to fix an end part of the contact portion 670 to the contact coupling structure 500 or to another component. Accordingly, no member like a clamp for securing the contact portion 670 is required, and thereby it is not necessary to consider a working space in a carrier head like a space necessary for bolt fastening to fix a clamp.

As shown in FIG. 2, the contact coupling structure 500 is connected to the lower part of the base 100 and can have a protruded shape. The contact coupling structure 500 provides a contact surface to the contact portion 670 of the substrate receiving member 600. The contact coupling structure 500 is desirably made of a substantially rigid material such as plastic, an aluminum alloy, or an iron alloy so that it is not easily deformed even though a force is applied thereto.

Fluid supplied through a fluid passage 210 is provided between the contact portion 670 and the securing portion 650. Then the contact portion 670 is pressed by fluid pressure and firmly contacts the contact coupling structure 500, thereby fluid is prevented from flowing out between the contact portion 670 and the contact coupling structure 500. The fluid between the securing portion 650 and the contact portion 670 also acts on the perimeter portion 620 and thereby applies downward pressure to the perimeter portion 620. Accordingly, a perimeter portion pressurizing chamber 200 can be defined by taking the securing portion 650 and the contact portion 670 as chamber walls. In case of FIG. 2, in addition to the securing portion 650 and the contact portion 670, the contact coupling structure 500 and the base 100 are also chamber walls that surround the perimeter portion pressurizing chamber 200. Components constituting the entire wall of a perimeter portion pressurizing chamber can be varied according to the shape of the components for constructing the carrier head 900, but the securing portion 650 and the contact portion 670 become always chamber walls of a perimeter portion pressurizing chamber. The perimeter portion pressurizing chamber 200 retains fluid supplied through the fluid passage 210 to keep a given pressure therein, and the pressure is applied to the substrate (not shown) through the perimeter portion 620 during a polishing process. As fluid, gas is preferable, and air or nitrogen may be used. Further, a plate portion pressurizing chamber 300, which is adjacent to the perimeter portion pressurizing chamber 200, is supplied with fluid through a fluid passage 310 and applies a polishing pressure to a substrate (not shown) through the plate portion 610.

Figure 3:
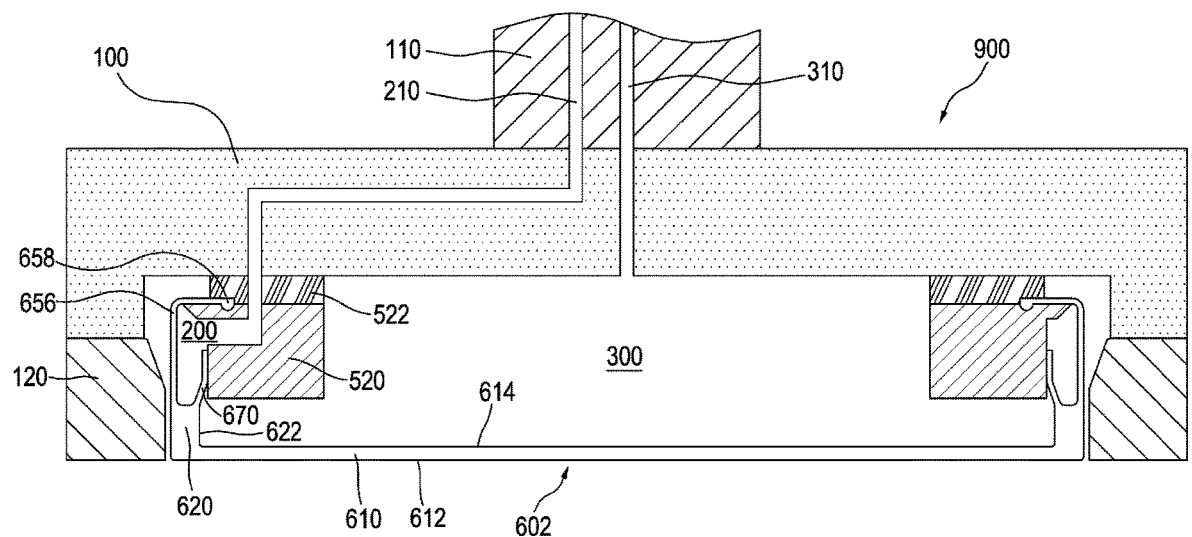
FIG. 3 is a cross-sectional view of a carrier head comprising a substrate receiving member according to another embodiment.

FIG. 3 is a cross-sectional view of a carrier head 900 comprising a substrate receiving member 602 according to another embodiment. Here, a securing portion 656 of the substrate receiving member 602 is extended from an outer part of the perimeter portion, and an end part of the securing portion 656 points toward an inner direction, that is toward the center of the carrier head 900. An end 658 of the securing portion 656 is secured between a connection member 522 and a contact coupling structure 520, and then connected to the lower part of the base 100. The contact portion 670 is extended from an inner part of the perimeter portion 620 and comes into contact with the contact coupling structure 520. Like this, the end 658 of the securing portion 656 can point toward the center of the carrier head 900, and also, as shown in FIG. 2, it can point toward the outside of the carrier head 900. In the present invention, although the end of securing portion can point toward various directions like above explained, the case where the securing portion 650 points outward as shown in FIG. 2 will be only taken as examples hereinafter for simplicity of the drawings.

Figure 4:
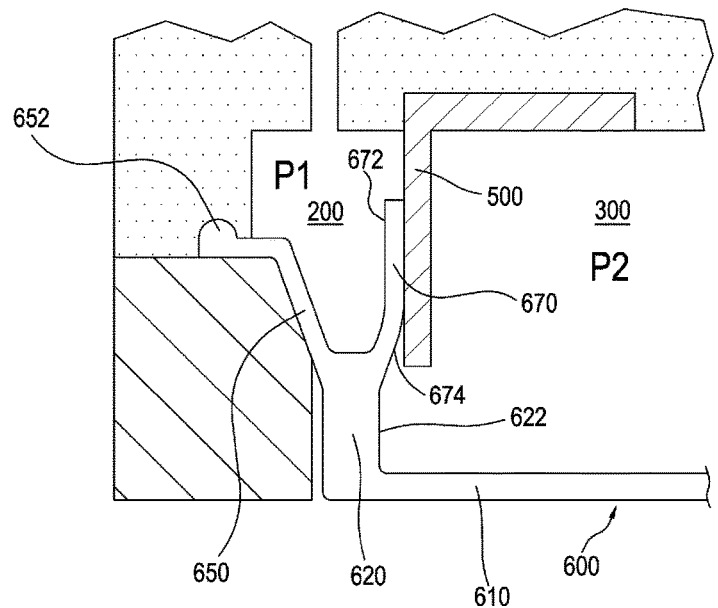
FIG. 4 is a cross-sectional view showing a behavior of a contact portion according to fluid pressure.

FIG. 4 is a cross-sectional view showing a behavior of a contact portion 670 according to fluid pressure. Here, pressure in the perimeter portion pressurizing chamber 200 is P1 and pressure in the plate portion pressurizing chamber 300 is P2. Accordingly, the pressure of P1 is applied to an outer side surface 672 (which is an inner side surface with respect to the perimeter portion pressurizing chamber 200, but is defined as the outer side surface because it faces toward the opposite direction to the center of the substrate receiving member 600) of the contact portion 670, and the pressure of P2 is applied to an inner side surface 622 of the perimeter portion 620 and an adjacent inner side surface 674 (which is an outer side surface with respect to the perimeter portion pressurizing chamber 200, but is defined as the inner side surface because it faces toward the center of the substrate receiving member 600) of the contact portion 670. When P1 is higher than P2, that is, when fluid pressure in the perimeter portion pressurizing chamber 200 is higher than that acting on the inner side surface 622 of the perimeter portion 620, a net pressure on the contact portion 670 is applied to the direction of the contact coupling structure 500 and makes the contact portion 670 contact firmly the contact coupling structure 500. Thereby, even if the pressure (P1) in the perimeter portion pressurizing chamber 200 is higher, fluid in the perimeter portion pressurizing chamber 200 is prevented from flowing to the inner side surface 622 of the perimeter portion 620.

Figure 5:
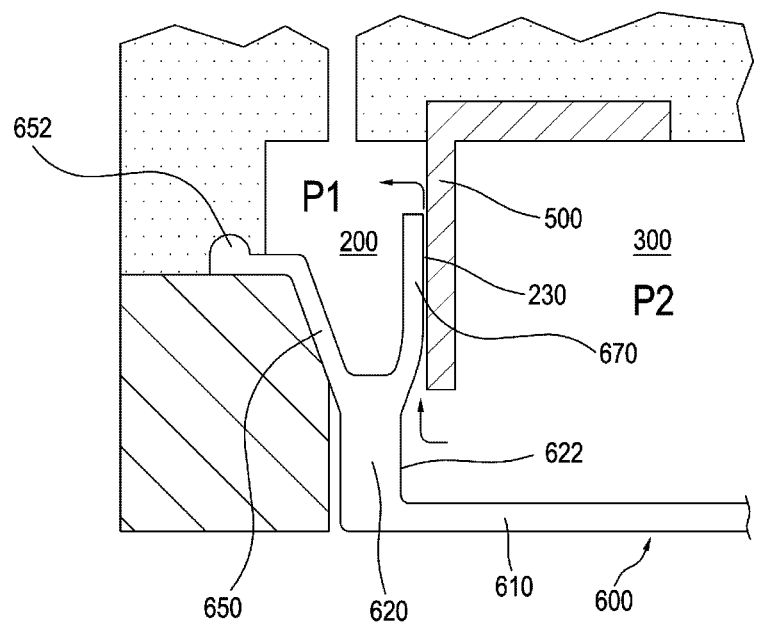
FIG. 5 is a cross-sectional view showing a case where fluid pressure (P2) acting on an inner side surface of a perimeter portion is higher than fluid pressure (P1) in a perimeter portion pressurizing chamber.

FIG. 5 is a cross-sectional view showing a case where fluid pressure (P2) acting on the inner side surface 622 of the perimeter portion 620 is higher than fluid pressure (P1) in the perimeter portion pressurizing chamber 200. In this case, a net pressure on the contact portion 670 is applied to a direction that makes the contact portion 670 come off from the contact coupling structure 500, so that a gap 230 can be formed between the contact portion 670 and the contact coupling structure 500. Thereby, as depicted by arrows, fluid acting on the inner side surface 622 of the perimeter portion 620 is allowed to flow into the perimeter pressurizing chamber 200 through the gap 230.

Therefore, according to a preferred embodiment of the present invention, the carrier head 900 for a chemical mechanical polishing apparatus comprising a substrate receiving member comprises: a base 100; a substrate receiving member 600 comprising a plate portion 610 having an outer surface 612 for receiving a substrate and an inner surface 614 at the back of the outer surface 612, a perimeter portion 620 extended in a height direction from an edge of the plate portion 610, a securing portion 650 extended from an outer part of the perimeter portion 620 and connected to a lower part of the base 100, and a contact portion 670 extended from an inner part of the perimeter portion 620; a contact coupling structure 500 connected to the lower part of the base 100 to provide a contact surface to the contact portion 670; and a perimeter portion pressurizing chamber 200 formed by taking the securing portion 650 and contact portion 670 as chamber walls when the contact portion 670 contacts firmly the contact coupling structure 500 by means of fluid pressure, wherein fluid in the perimeter portion pressurizing chamber 200 is prevented from flowing to an inner side surface 622 of the perimeter portion 620 when fluid pressure in the perimeter portion pressurizing chamber 200 is higher than fluid pressure acting on the inner side surface 622 of the perimeter portion 620, but fluid acting on the inner side surface 622 of the perimeter portion 620 is allowed to flow into the perimeter portion pressurizing chamber 200 when fluid pressure acting on the inner side surface 622 of the perimeter portion 620 is higher than fluid pressure in the perimeter portion pressurizing chamber 200.

Figure 6:
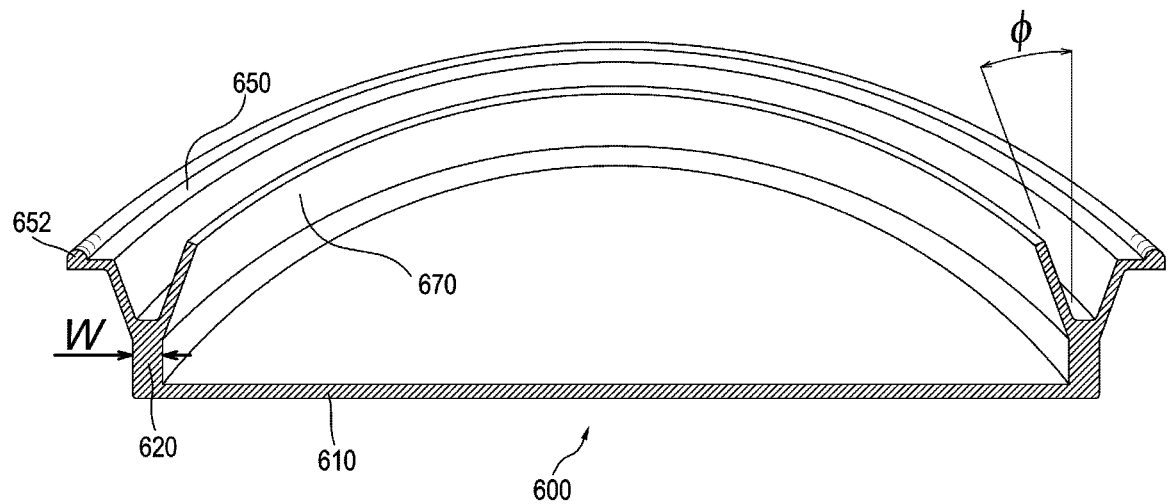
FIG. 6 is a sectional perspective view of a substrate receiving member according to a preferred embodiment of the present invention.

FIG. 6 is a sectional perspective view of a substrate receiving member 600 according to a preferred embodiment of the present invention. As shown, the substrate receiving member 600 may be wholly made of a single material, and a flexible material is preferred. Rubber may be used as a flexible material, and preferably, rubber having good water and chemical resistances, such as silicone rubber and ethylene propylene diene monomer (EPDM) rubber, may be used. The substrate receiving member 600 made of a flexible material may be fabricated using molding method. The plate portion 610 is circular and can have a thickness of 0.5 mm to 2.0 mm. The perimeter portion 620 can have a width W of 1 mm to 10 mm. Even though not shown, the plate portion 610 and the perimeter portion 620 of the substrate receiving member 600 can be made of a rubber having high hardness (for example, shore A hardness of 70), while the securing portion 650 and the contact portion 670 are made of a rubber having low hardness (for example, shore A hardness of 40). As shown, the end part of the securing portion 650 points outward (in a direction getting away from the center of the substrate receiving member), and even if not shown here, it can point inward, upward or downward. On the other hand, the end part of the contact portion 670 preferably points toward an upper-inner direction (a direction having both upward and inward components). If the end part of the contact portion 670 points toward a horizontal direction, it is not easy to insert the contact portion 670 to the outer peripheral surface of the contact coupling structure 500. If the end part of the contact portion 670 points toward a vertical direction, it is hard to achieve a solid contact between the contact portion 670 and the contact coupling structure 500. The amount of tilt of the contact portion 670 can be defined as an angle Ø made between the direction of the contact portion 670 and a vertical direction. If the end part of the contact portion 670 points toward a vertical direction, the angle Ø is 0°, and as shown in FIG. 6, if the end part of the contact portion 670 points toward an upper-inner direction, the angle Ø is between 0° and 90°. If the end part points toward a horizontal direction, the angle Ø becomes 90°. So as to achieve both smooth mounting to the contact coupling structure and a solid contact after inserting, the angle Ø is preferred to be in a range of 2° to 45°.

Figure 7:
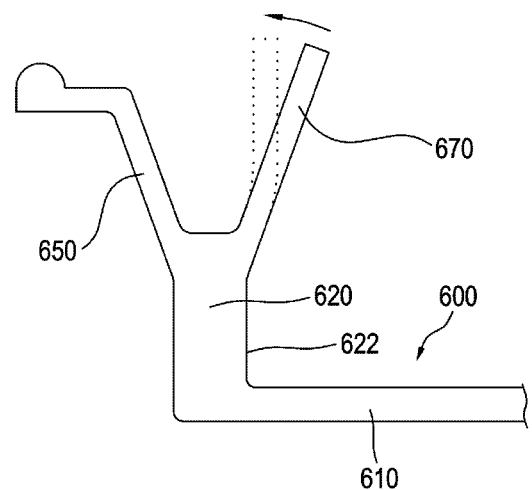
FIG. 7 is a partial cross-sectional view explaining a bending of a contact portion.

FIG. 7 is a partial cross-sectional view explaining a bending of the contact portion 670. In a condition where the substrate receiving member 600 is not mounted to the base, as shown, the contact portion 670 can be extended straightly. When the substrate receiving member 600 is mounted to the base 100, as shown in FIG. 2, the contact portion 670 is bent to a direction of the arrow in FIG. 7 to be inserted to the outer peripheral of the contact coupling structure 500. Three-dimensionally, the circular edge periphery of the contact portion 670 is elongated to allow the cylindrical contact coupling structure 500 to be inserted into the edge periphery. After inserting, the contact portion 670 is in contact with the contact coupling structure 500 under a condition of being bent (indicated by a dotted line), and thereby the contact becomes solid by means of a force to return to its original shape.

Therefore, according to a preferred embodiment of the present invention, the substrate receiving member 600 of the carrier head 900 for a chemical mechanical polishing apparatus comprises: a plate portion 610 having an outer surface 612 for receiving a substrate and an inner surface 614 at the back of the outer surface 612; a perimeter portion 620 extended in a height direction from an edge of the plate portion 610; a securing portion 650 extended from an outer part of the perimeter portion 620; and a contact portion 670 extended from an inner part of the perimeter portion 620.

Figure 8:
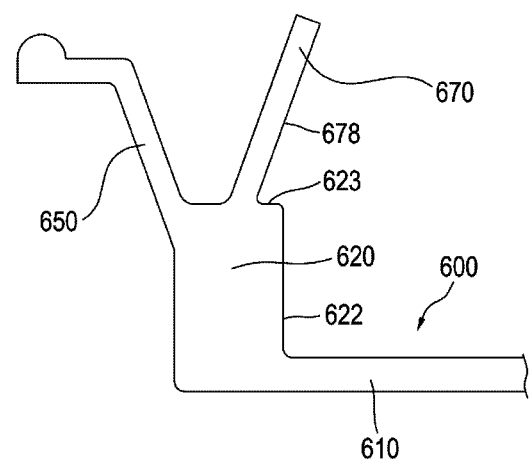
FIG. 8 is a partial cross-sectional view showing a location of a contact portion.

FIG. 8 is a partial cross-sectional view showing a location of a contact portion 670. Although the contact portion 670 is extended from an inner part of the perimeter portion 620, the inner side surface 622 of the perimeter portion 620 is not continuously connected to an inner side surface 678 of the contact portion 670, so that a top surface 623 of the perimeter portion 620 can be exposed. In the same manner as above, although not shown, the securing portion 650 can be extended from a part which is not the outermost peripheral portion of the perimeter portion 620. That is, the inner and outer parts of the perimeter portion 620 from which the securing portion 650 and the contact portion 670 are extended mean relative positions with respect to the center of the perimeter portion 620, and they do not necessarily mean the innermost or outermost part of the perimeter portion 620.

Figure 9:
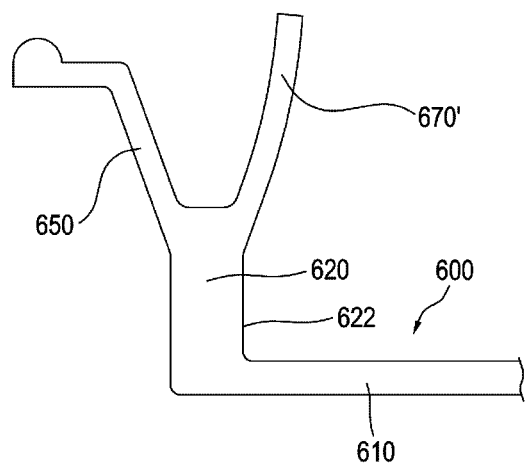
FIGS. 9 and 10 are partial cross-sectional views showing other embodiments of substrate receiving members.
Figure 10:
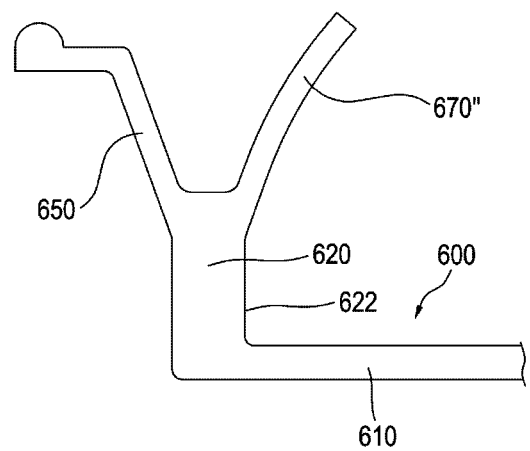

FIGS. 9 and 10 are partial cross-sectional views showing other embodiments of substrate receiving members. Contact portions 670' and 670" can be extended in an upper-inner direction with given curvatures. As shown in FIG. 9, first, the contact portion 670' can be curved inwardly, and as shown in FIG. 10, on the other hand, the contact portion 670" can be curved outwardly.

Figure 11:
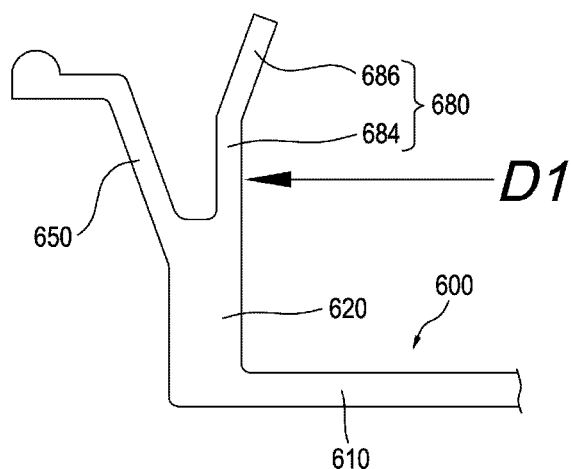
FIGS. 11 and 12 are partial cross-sectional views showing yet other embodiments of substrate receiving members.
Figure 12:
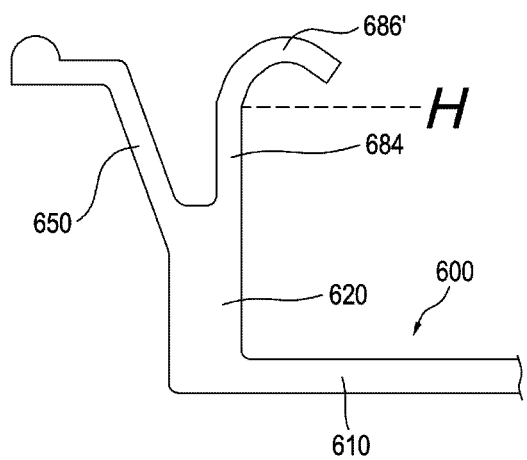

FIGS. 11 and 12 are partial cross-sectional views showing yet other embodiments of substrate receiving members, wherein contact portions having different shapes are shown. As shown in FIG. 11, first, a contact portion 680 comprises a substantially vertical guide portion 684 connected to the inner part of the perimeter portion 620 and a firm contact portion 686 extended in an upper-inner direction from the guide portion 684. It is preferred that an inner diameter DI of the guide portion 684 be slightly larger than an outer diameter of a contact coupling structure to be inserted (not shown), thereby preventing the contact coupling structure from being blocked onto the guide portion 684 when moving down to the lower end of the perimeter portion 620. Since the firm contact portion 686 is extended in the upper-inner direction from the guide portion 684, it tightens the cylindrical contact coupling structure (not shown) after inserting, and thereby a firm contact is achieved. FIG. 12 shows a case where a firm contact portion 686' is extended in an upper-inner direction from the guide portion 684 and is then bent inwardly. If the firm contact portion 686' is bent, a force to return to its original shape becomes stronger after being fitted to the contact coupling structure. However, the end of the firm contact portion 686' is desirably located higher than a position (indicated by reference symbol H in FIG. 12) of the guide portion 684 from which the firm contact portion 686' is extended, thereby preventing the firm contact portion 686' and the guide portion 684 from being laminated onto each other when inserting the firm contact portion 686' to the contact coupling structure.

Figure 13:
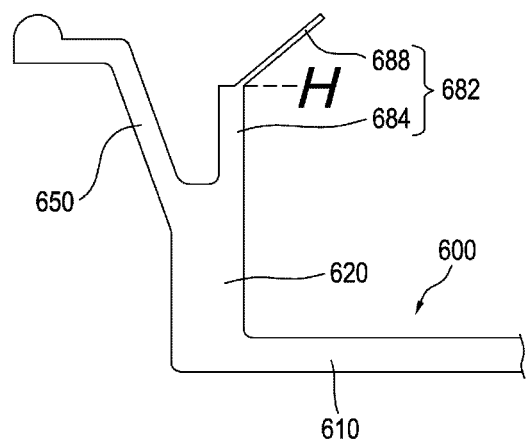
FIG. 13 is a partial cross-sectional view showing another example of a contact portion.

FIG. 13 is a partial cross-sectional view showing another example of a contact portion, and in this case, a thickness of a firm contact portion 688 is smaller than that of the guide portion 684. Like this, if the firm contact portion 688 is thinner than the guide portion 684, tilt angle of the firm contact portion 688 can be larger as shown. The firm contact portion 688 can have a thickness value of 0.2 to 0.6 times of the guide portion 684. Even though not shown, also, the firm contact portion 688 can be extended in an upper-inner direction from the guide portion 684 and then bent inwardly, similarly to FIG. 12, and even at this time, the end of the firm contact portion 688 is desirably located higher than a position (indicated by reference symbol H in FIG. 13) of the guide portion 684 from which the firm contact portion 688 is extended.

Figure 14:
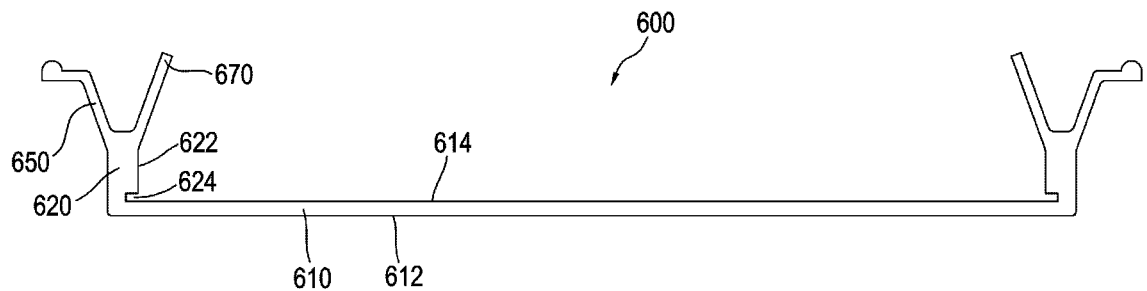
FIG. 14 is a cross-sectional view showing still yet another embodiment of a substrate receiving member.

FIG. 14 is a cross-sectional view showing still yet another embodiment of substrate receiving member 600. Here, a groove 624 is formed as an auxiliary receiving structure along the inner side surface 622 of the perimeter portion 620. A ring or circular plate made of a substantially rigid material like metal or plastic can be inserted into the groove 624. If a ring or a circular plate having a slightly larger diameter than that of the groove 624 is inserted into the groove 624, the plate portion 610, which may sag, can be tightened. Although only one groove 624 is explained above, but of course, one or more grooves may be formed in the perimeter portion.

Figure 15:
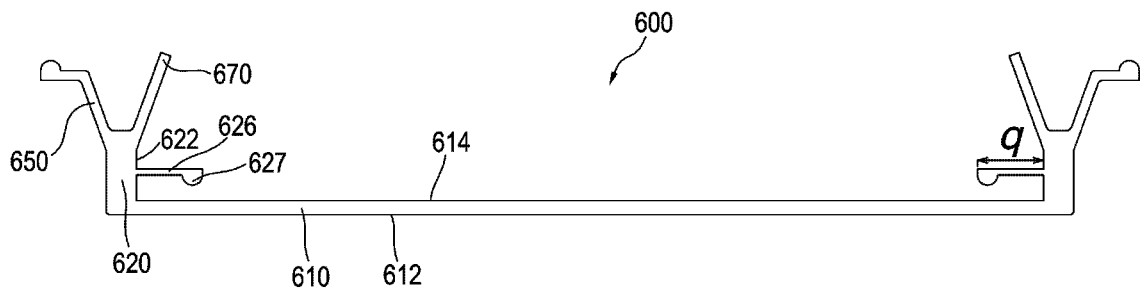
FIG. 15 is a cross-sectional view showing still yet another embodiment of a substrate receiving member.

FIG. 15 is a cross-sectional view showing still yet another embodiment of substrate receiving member 600. Here, a receiving flap 626 is extended inwardly from the inner side surface 622 of the perimeter portion between the contact portion 670 and the plate portion 610. The receiving flap 626 is ring-shaped and made of the same material as the substrate receiving member 600, and preferably made at the same time when the substrate receiving member 600 is made. An extended length q of the receiving flap 626 can be in a range of 5 mm to 20 mm, and a thickness thereof can be in a range of 0.3 mm to 1 mm. The receiving flap 626 can have an O-ring structure 627 located at the end thereof to achieve a solid securing.

Figure 16:
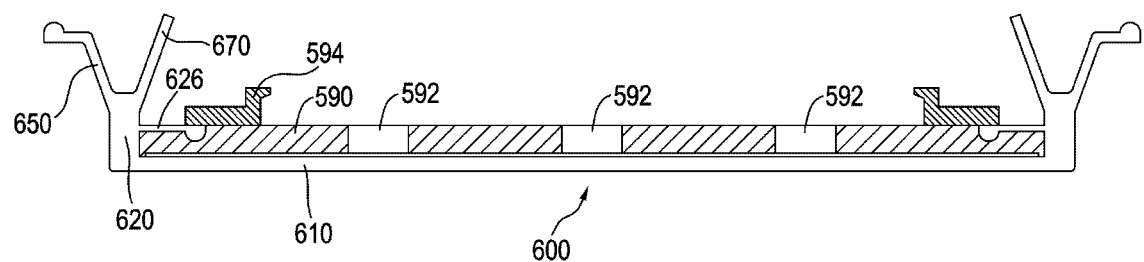
FIG. 16 is a cross-sectional view showing a circular plate mounted in above-mentioned substrate receiving member.

FIG. 16 is a cross-sectional view showing a circular plate 590 received in above-mentioned substrate receiving member 600 of FIG. 15. The circular plate 590 is preferably made of a substantially rigid material like metal or plastic. After the circular plate 590 is inserted between the plate portion 610 and the receiving flap 626, a clamp 594 is fastened to the circular plate 590 by means of bolts (not shown), so that the circular plate 590 can be fixed to the substrate receiving member 600. At this time, the plate portion 610 can be prevented from sagging by receiving the circular plate 590 having a slightly larger diameter than the inner diameter of the perimeter portion 620. Further, preferably, the circular plate 590 has perforated holes 592 formed thereon so that fluid can freely act on the plate portion 610. In FIG. 16 although it is shown only the circular plate 590 is received in the substrate receiving member 600, a ring can be also received therein instead of the plate.

Figure 17:
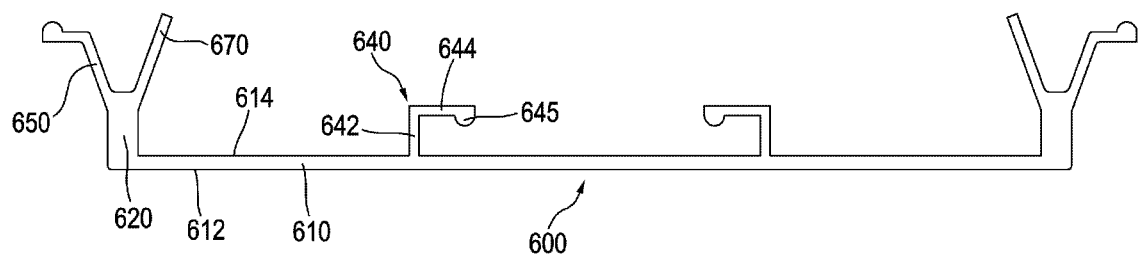
FIG. 17 is a cross-sectional view showing still yet another embodiment of a substrate receiving member.

FIG. 17 is a cross-sectional view showing still yet another embodiment of a substrate receiving member 600. Here, a fixing flap 640 is extended upwardly from the inner surface 614. The fixing flap 640 comprises a first portion 642 connected to the inner surface 614 and extended upwardly, and second portion 644 extended sidewardly from the end of the first portion 642. The fixing flap 640 is ring-shaped on the whole and can have an O-ring structure 645 located at the end thereof to achieve a solid securing. The fixing flap 640 is preferably made of the same material as the substrate receiving member 600, and can be formed at the same time when the substrate receiving member 600 is made.

Figure 18:
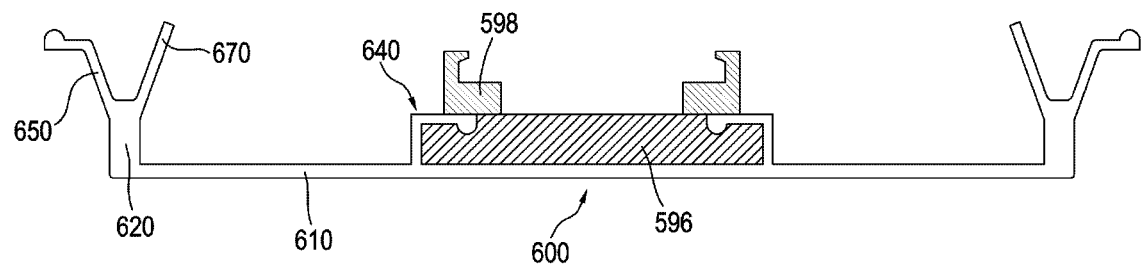
FIG. 18 is a cross-sectional view showing a circular plate mounted in above-mentioned substrate receiving member.

FIG. 18 is a cross-sectional view showing a circular plate 596 mounted in above-mentioned substrate receiving member 600 of FIG. 17. After the circular plate 596 is inserted between the plate portion 610 and the fixing flap 640, a clamp 598 is fastened to the circular plate 596 by means of bolts (not shown), so that the circular plate 596 can be fixed to the substrate receiving member 600. Next, the clamp 598 is connected to a lower part of a base (not shown) so that the center area of the substrate receiving member 600 can be solidly mounted to the base (not shown).

Figure 19:
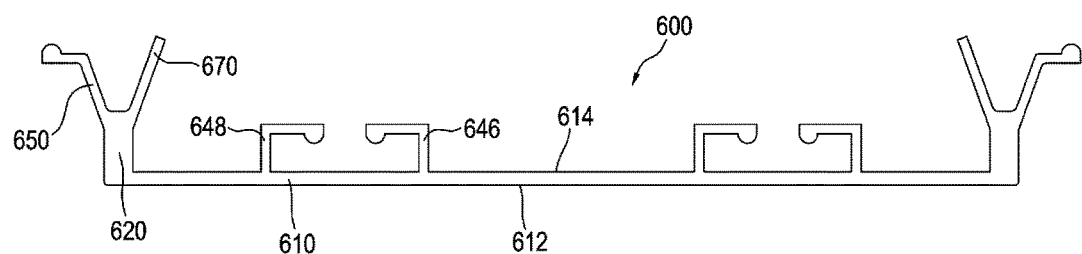
FIG. 19 is a cross-sectional view of a substrate receiving member showing another example of fixing flaps.

FIG. 19 is a cross-sectional view of a substrate receiving member 600 showing another example of fixing flaps 646, 648. Here, an inner fixing flap 646 and an outer fixing flap 648 are extended upwardly from the inner surface 614, the outer fixing flap 648 being located on the outside of the inner fixing flap 646. Even though not shown, a ring-shaped plate can be inserted between the inner fixing flap 646 and the outer fixing flap 648 and fixed to the substrate receiving member 600 by means of a clamp (not shown), which can make the substrate receiving member 600 solid. Like this, fixing flaps can be located on other areas of the plate portion 610 as well as a center area thereof, and a plurality of fixing flaps can be located on both center and outer areas.

Figure 20:
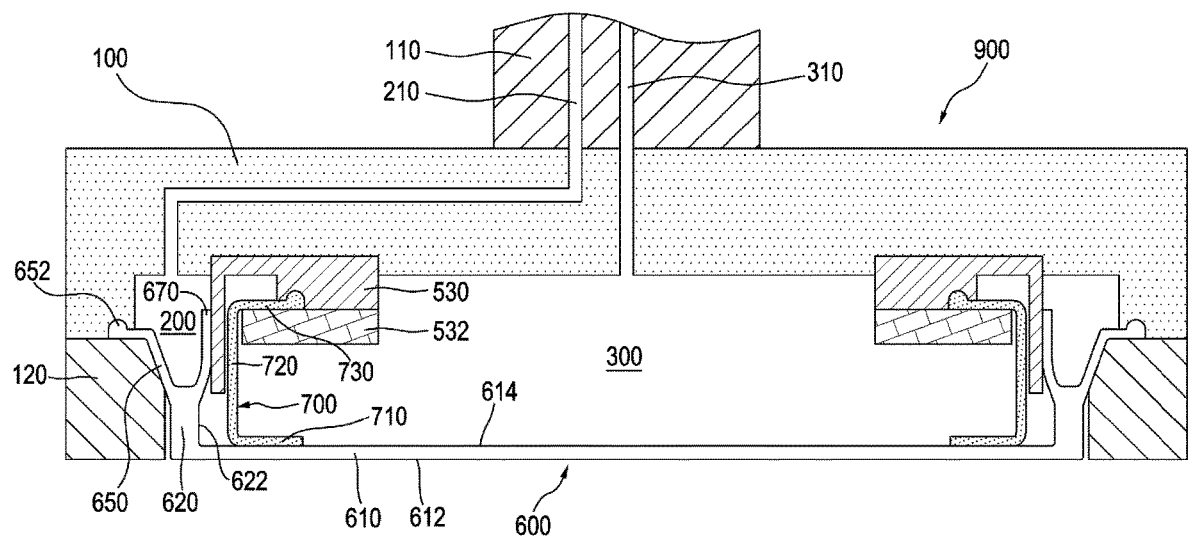
FIG. 20 is a cross-sectional view of a carrier head having a contact flap.

FIG. 20 is a cross-sectional view of a carrier head 900 having a contact flap 700. The contact flap 700 is a member to prevent fluid from flowing into the perimeter portion pressurizing chamber 200. As shown, a top portion 730 of the contact flap 700 is connected to the lower part of the base 100 through being fastened between a contact coupling structure 530 and a clamp 532. Even though not shown, the top portion 730 may be connected directly to the lower part of the base 100. A side portion 720 is extended downwardly from the top portion 730, and a bottom portion 710 is extended inwardly from a bottom end of the side portion 720. The contact flap 700 is positioned adjacently to and inward of the perimeter portion 620, that is, in a shape that the perimeter portion 620 surrounds the contact flap 700, so that the bottom portion 710 comes into contact with an area of the plate portion 610.

Figure 21:
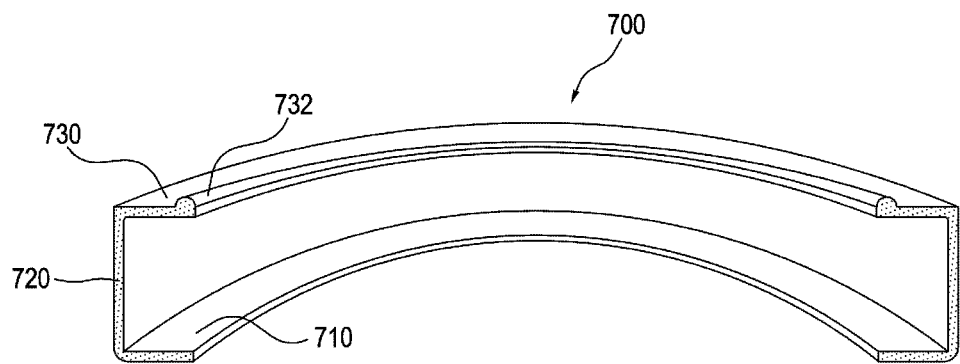
FIG. 21 is a perspective sectional view showing an example of a contact flap.

FIG. 21 is a perspective sectional view showing an example of the contact flap 700. On the whole the contact flap 700 has a ring-shape, and if only one side is cut, a cross section can have an image similar to "[". An O-ring structure 732 can be formed at the top portion 730 to facilitate a tight sealing. The contact flap 700 has an open structure so that it can not form alone any chamber for keeping fluid therein even if the top portion 730 is connected to the lower part of the base 100. The contact flap 700 can form a chamber when it is coupled to the substrate receiving member 600. The contact flap 700 is preferably formed of a flexible material, and rubbers such as silicone rubber, chloroprene rubber or ethylene propylene diene monomer (EPDM) rubber can be used as a flexible material. The thickness of the contact flap 700 except the O-ring structure 732 can be in a range of 0.3 mm to 2 mm.

Figure 22:
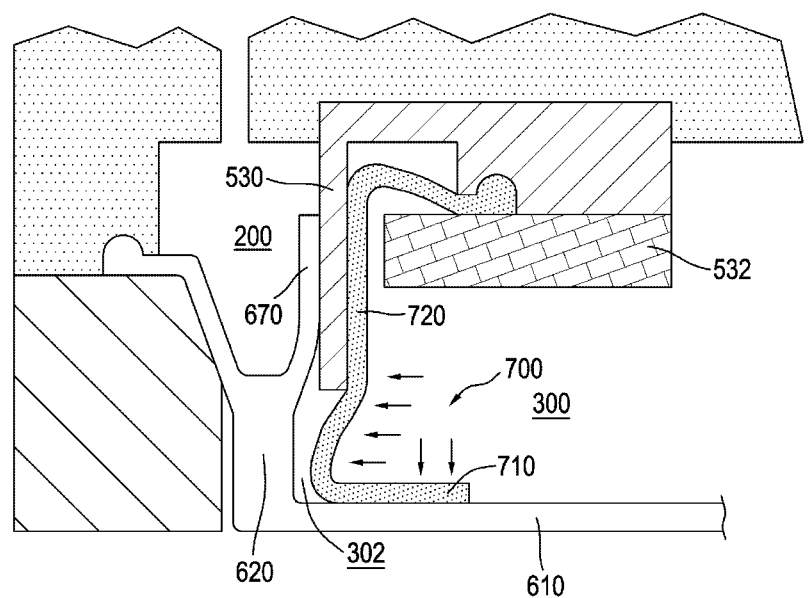
FIG. 22 is a cross-sectional view explaining how the contact flap functions.

FIG. 22 is a cross-sectional view explaining how the contact flap 700 functions. In case where there is no contact flap, as shown in FIG. 5, fluid in the plate portion pressurizing chamber 300 can keep flowing into the perimeter pressurizing chamber 200 if fluid pressure in the plate portion pressurizing chamber 300 is higher than that in the perimeter portion pressurizing chamber 200. However, as shown in FIG. 22, if the contact flap 700 is positioned adjacent to and inside of the perimeter portion 620, fluid flow from the inside of the contact flap 700 (that is, from the plate portion pressurizing chamber 300) into the perimeter pressurizing chamber 200 is prevented, so that fluid cannot keep flowing into the perimeter portion pressurizing chamber 200. This is because when fluid pressure in the inside of the contact flap 700 is applied to the contact flap 700 as indicated by the straight arrows, an expansion of the side portion 720 is stopped by a contact with the contact coupling structure 530 and the bottom portion 710 comes into contact with the plate portion 610 removing a gap through which the fluid can flow. When the contact flap 700 is installed, an intermediate zone 302 is formed between the contact flap 700 and the perimeter portion 620. Since no fluid is supplied independently to the intermediate zone 302, the pressure of the zone may not be easily controlled, unlike the perimeter portion pressurizing chamber 200 or the plate portion pressurizing chamber 300. Accordingly, the contact flap 700 is desirably positioned close to the perimeter portion 620 to minimize the area of the plate portion 610 pressurized by the intermediate zone 302. As the contact flap 700 is partially expanded through a gap between the contact coupling structure 530 and the plate portion 610, the pressure in the intermediate zone 302 can be raised, which can result in a fluid flow into the perimeter portion pressurizing chamber 200. However, if the partial expansion stops, the fluid flow also stops.

Figure 23:
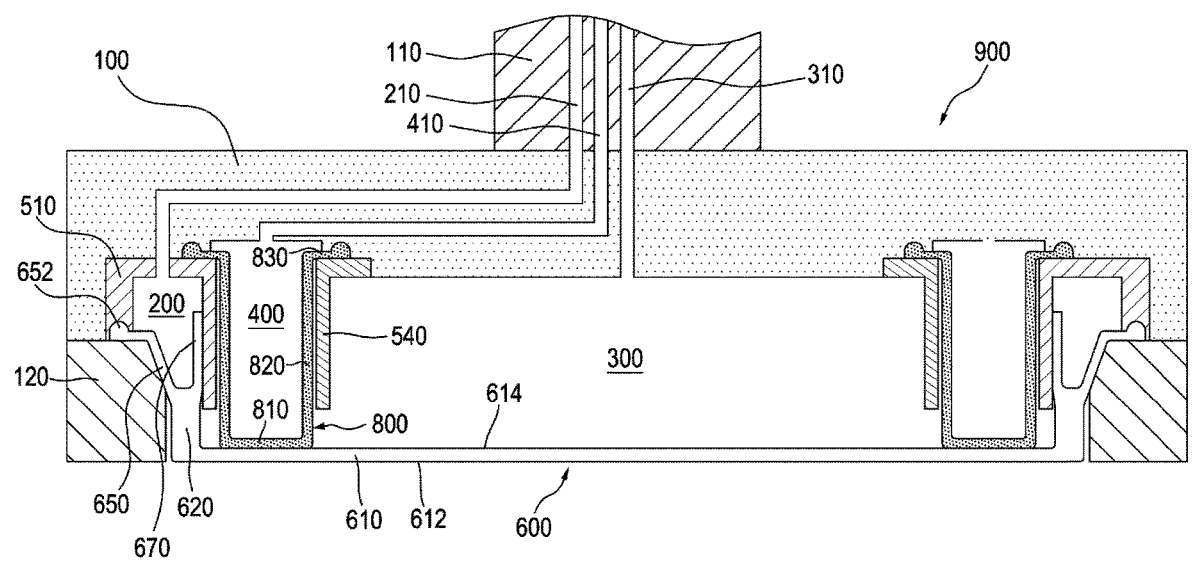
FIG. 23 is a cross-sectional view of a carrier head having a bladder.

FIG. 23 is a cross-sectional view of a carrier head having a bladder 800. The bladder 800 is a member for applying pressure independently to a predetermined area of the plate portion 610, and is positioned adjacent to and inside of the perimeter portion 620. The bladder 800 is supplied independently with fluid from a fluid passage 410 to form a bladder chamber 400 which can expand and make a bottom portion 810 come into contact with the plate portion 610. Through this contact a pressure is applied to the plate portion 610. The bladder 800 is on the whole ring-shaped and has two fixing portions 830 extended outwardly at the top, which are used for the connection of the bladder 800 to the lower part of the base 100 by means of a contact coupling structure 510 and a wall structure 540. The contact coupling structure 510 and the wall structure 540 not only connect the bladder 800 but also play a role to limit a lateral expansion of the bladder 800 by contacting two side portions 820. In more detail, the contact coupling structure 510 limits the expansion of the bladder 800 to an outer direction, and the wall structure 540 limits the expansion of the bladder 800 to an inner direction. Accordingly, the bladder 800 comes into contact and applies a pressure to a predetermined area of the plate portion 610 defined by the contact coupling structure 510 and the wall structure 540. The bladder 800 is preferably formed of a flexible material, and rubbers such as silicone rubber, chloroprene rubber or ethylene propylene diene monomer (EPDM) rubber can be used as a flexible material.

Figure 24:
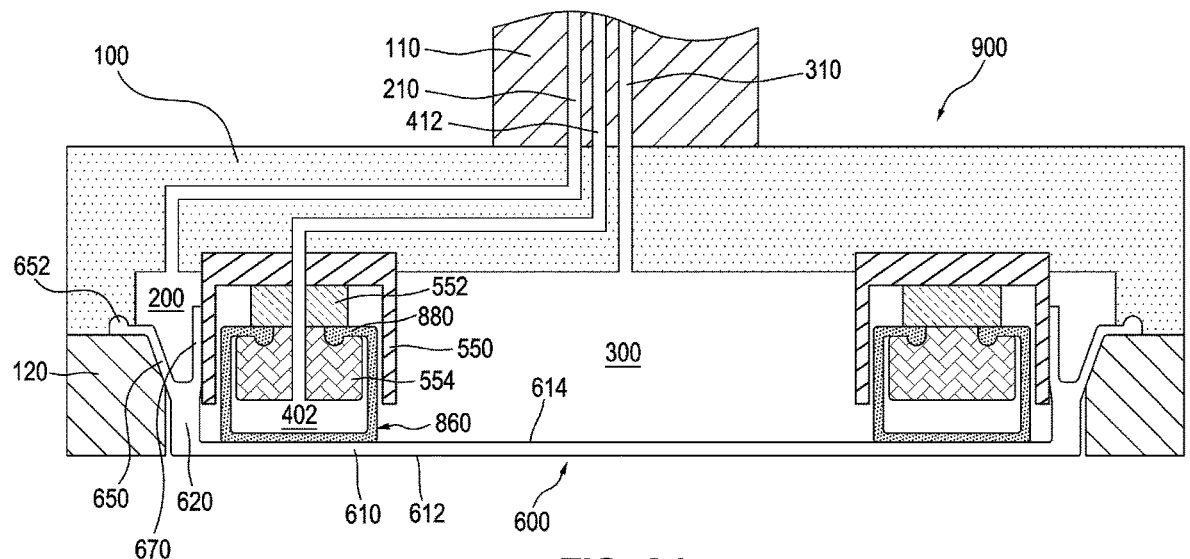
FIG. 24 is a cross-sectional view of a carrier head having another type of bladder.

FIG. 24 is a cross-sectional view of a carrier head 900 having another type of bladder 860. As shown, the bladder 860 has fixing portions 880 extended inwardly and fixed between a first clamp 552 and a second clamp 554. The bladder 860 is connected to the lower part of the base 100 by securing the first clamp 552 to a wall structure 550. The bladder 860 is supplied with fluid from a fluid passage 412 to form a bladder chamber 402 which can expand and come into contact with the plate portion 610. Through this contact a pressure is applied to the plate portion 610 of the substrate receiving member 600. The wall structure 550 limits a lateral expansion of the bladder 860 and at the same time serves as a contact coupling structure with which the contact portion 670 comes into contact.

Figure 25:
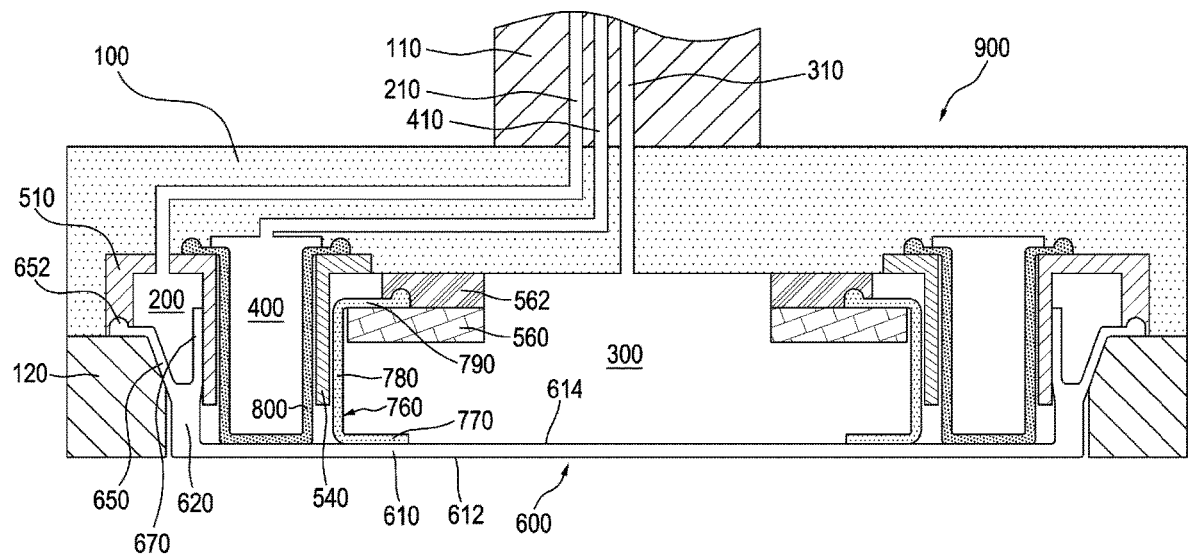
FIG. 25 is a cross-sectional view of a carrier head having both a bladder and a contact flap.

FIG. 25 is a cross-sectional view of a carrier head having both a bladder 800 and a contact flap 760. As shown, the bladder 800 is connected to the lower part of the base 100 and positioned adjacent to and inside of the perimeter portion 620 to apply a pressure independently to a predetermined area of the plate portion 610, and a contact flap 760 is connected to the lower part of the base 100 adjacent to and inside (exterior side but closer to the center of the plate portion 610) of the bladder 800 by securing a top portion 790 between a first flap clamp 560 and a second flap clamp 562. A side portion 780 is extended downwardly from the top portion 790 and a bottom portion 770 is extended inwardly from a bottom end of the side portion 780. As shown, the contact flap 760 is an open structure, therefore only when the bottom portion 770 comes into contact with the plate portion 610, it can keep fluid therein. In more detail, when fluid in the inside of the contact flap 760 is acting on the contact flap 760, the side portion 780 comes into contact with the wall structure 540 and thereby a lateral expanding is limited while the bottom portion 770 comes into contact with the plate portion 610 to remove a gap through which the fluid can flow. Through above mechanism, fluid in the inside of the contact flap 760 is prevented from flowing to a side of the bladder 800.

Figure 26:
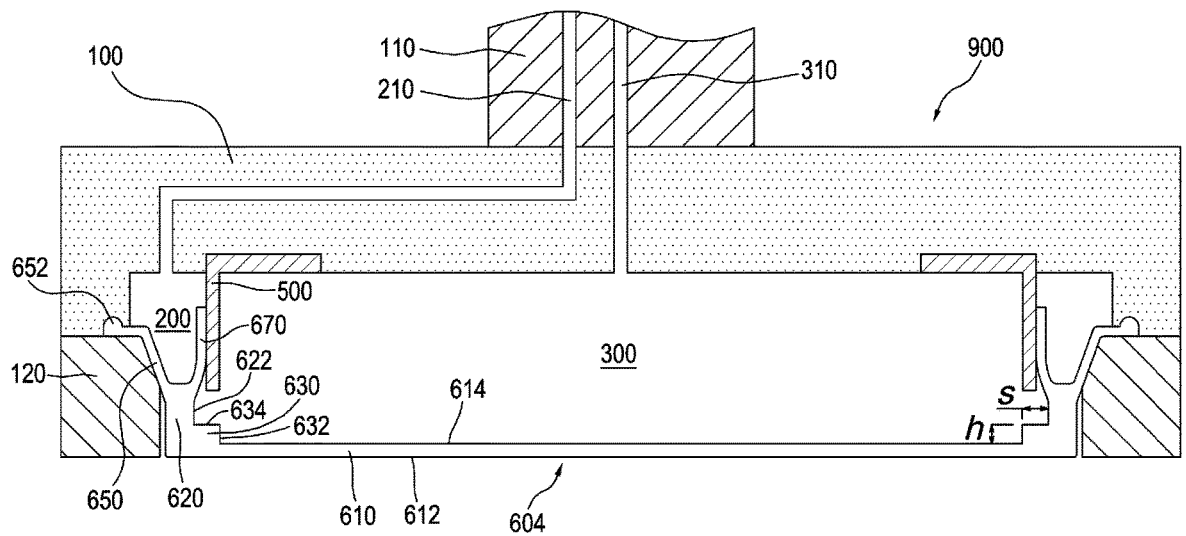
FIG. 26 is a cross-sectional view of a carrier head having a substrate receiving member according to another embodiment of the present invention.

FIG. 26 is a cross-sectional view of a carrier head having a substrate receiving member 604 according to another embodiment of the present invention. Here, the substrate receiving member 604 has a protruding structure 630 formed at a corner where the perimeter portion 620 and the inner surface 614 meet each other. Three-dimensionally, the protruding structure 630 has a shape of a ring like the perimeter portion 620. The protruding structure 630 is preferably made of the same material as the substrate receiving member 604, and can be formed at the same time when the substrate receiving member 604 is made. As shown, the protruding structure 630 has a shape of a step with a side face 632 and a top face 634. Here, a height h of the protruding structure 630 can be in a range of 3 mm to 15 mm, and a width s in a range of 4 mm to 20 mm.

Figure 27:
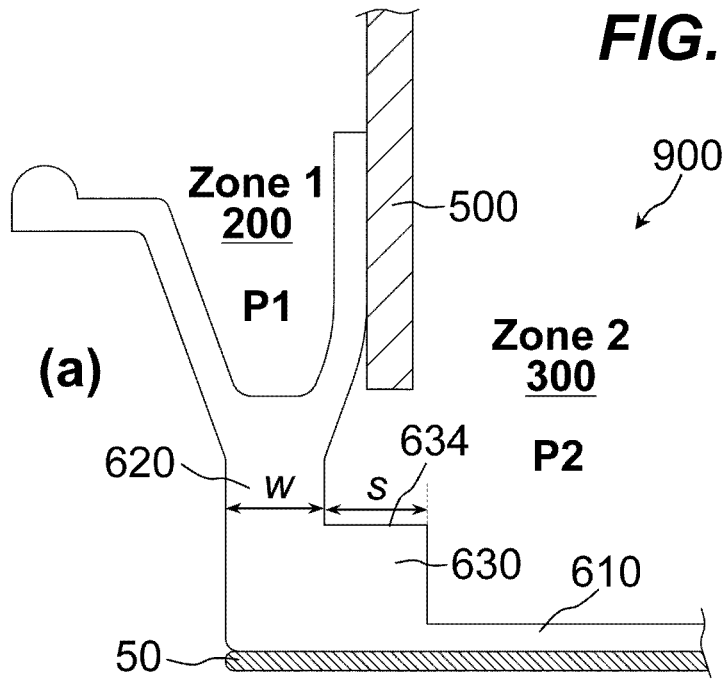
FIG. 27a is a partial cross-sectional view of a carrier head with a protruding structure showing that the pressure of Zone 1 and Zone 2 are P1 and P2 respectively.
FIG. 27b is a graph showing how pressure P1 of Zone 1 and pressure P2 of Zone 2 are applied respectively to a substrate according to a position thereof.
FIG. 27c is a graph showing a total pressure applied to a substrate.
Figure 28:
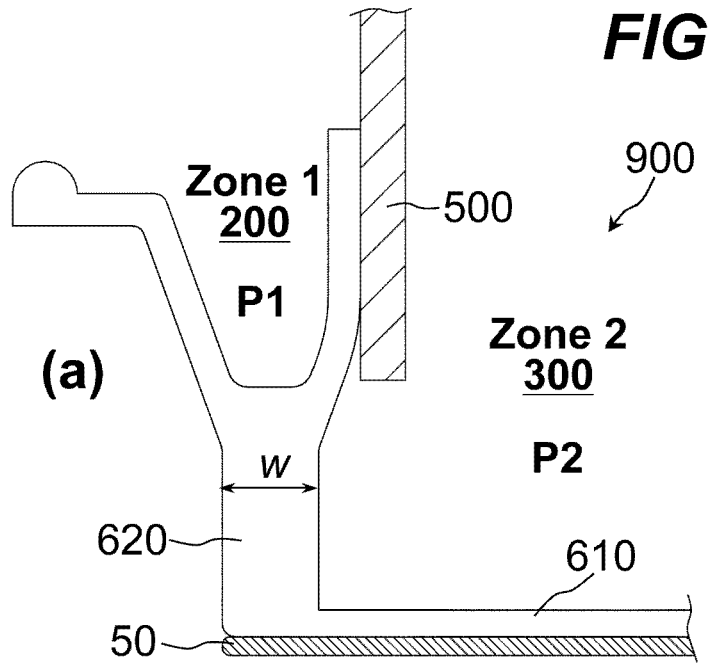
FIG. 28a is a partial cross-sectional view of a carrier head without a protruding structure showing the pressure of each zone.
FIGS. 28b and 28c are graphs showing pressures applied to a substrate in case substrate receiving member has no protruding structure.
Figure 28:
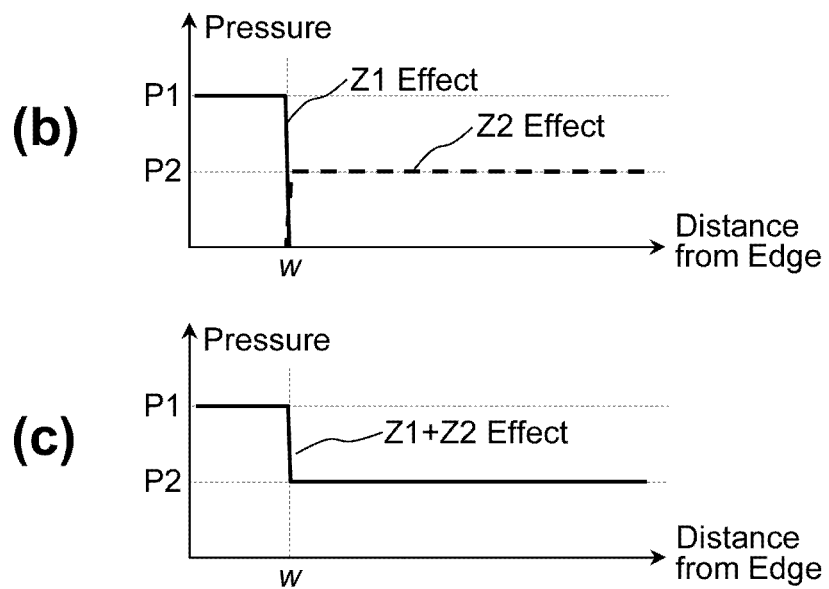

FIGS. 27 and 28 are partial cross-sectional views and graphs for explaining a pressure dispersing function of the protruding structure 630. First, referring to FIG. 27a showing partial cross-sectional view of a carrier head 900, a pressure P1 is applied to the perimeter portion pressurizing chamber 200 as indicated by Zone 1 and a pressure P2 is applied to the plate portion pressurizing chamber 300 as indicated by Zone 2. These pressures are applied to a substrate 50 through the plate portion 610, the perimeter portion 620 and the protruding structure 630. The protruding structure 630 can be considered as a shape formed by increasing the thickness of the plate portion 610 at the corner, or a shape formed by increasing the thickness of the perimeter portion 620 at the corner. Accordingly, the protruding structure 630 has characteristics of both the plate portion 610 and the perimeter portion 620. This is shown in FIGS. 27b and 27c. If the pressure P1 of the perimeter portion pressurizing chamber 200 is applied to a top side of the perimeter portion 620 having a width w, the pressure P1 is transferred down to the direction of the substrate 50, and at the same time this downward pressure is dispersed to the protruding structure 630. As a result, the pressure acting on the substrate 50 from the perimeter portion pressurizing chamber 200 in function of a distance from an edge of the substrate 50 is varied like the graph Z1 Effect of FIG. 27b. In the same manner as above, if the pressure P2 of the plate portion pressurizing chamber 300 is applied to the top face 634 of the protruding structure 630 having a width s, the pressure P2 is transferred down to direction of the substrate 50, and at the same time this downward pressure is dispersed to the perimeter portion 620. As a result, the pressure acting on the substrate 50 from the plate portion pressurizing chamber 300 in function of a distance from the edge of the substrate 50 is varied like the graph Z2 Effect of FIG. 27b. Accordingly, a pressure finally applied to the substrate 50 is produced by adding all pressures applied to the substrate 50, so that it is varied as shown by the graph Z1+Z2 effect of FIG. 27c. Here, it can be appreciated that through the protruding structure 630, the pressure applied to the substrate 50 is not sharply varied when the source of pressure is changed from the Zone 1 of the perimeter portion pressurizing chamber 200 to the Zone 2 of the plate portion pressurizing chamber 300. That is, an area under the influences of Zone 1 and Zone 2 at the same time is widened due to the protruding structure 630, so that the pressure changes gradually. To the contrary, if there is no protruding structure 630, as shown in FIGS. 28a to 28c, the amount of dispersed pressure is extremely small when the pressures P1 and P2 are transferred to the substrate 50. Accordingly, the pressure applied to the substrate 50 is sharply changed when moving from Zone 1 to Zone 2.

Therefore, with reference to FIG. 26, according to yet another preferred embodiment of the present invention, the carrier head 900 for a chemical mechanical polishing apparatus comprising a substrate receiving member comprises: a base 100; a substrate receiving member 604 comprising a plate portion 610 having an outer surface 612 for receiving a substrate and an inner surface 614 at the back of the outer surface 612, a perimeter portion 620 extended in a height direction from an edge of the plate portion 610, a securing portion 650 extended from an outer part of the perimeter portion 620 and connected to a lower part of the base 100, and a contact portion 670 extended from an inner part of the perimeter portion 620, and a protruding structure 630 formed at a corner where the perimeter portion 620 and the inner surface 614 meet each other; a contact coupling structure 500 connected to the lower part of the base 100 to provide a contact surface to the contact portion 670; and a perimeter portion pressurizing chamber 200 formed by taking the securing portion 650 and contact portion 670 as chamber walls when the contact portion 670 contacts firmly with the contact coupling structure 500 by means of fluid pressure, wherein fluid in the perimeter portion pressurizing chamber 200 is prevented from flowing to an inner side surface 622 of the perimeter portion 620 when fluid pressure in the perimeter portion pressurizing chamber 200 is higher than fluid pressure acting on the inner side surface 622 of the perimeter portion 620, but fluid acting on the inner side surface 622 of the perimeter portion 620 is allowed to flow into the perimeter portion pressurizing chamber 200 when fluid pressure acting on the inner side surface 622 of the perimeter portion 620 is higher than fluid pressure in the perimeter portion pressurizing chamber 200.

Figure 29:
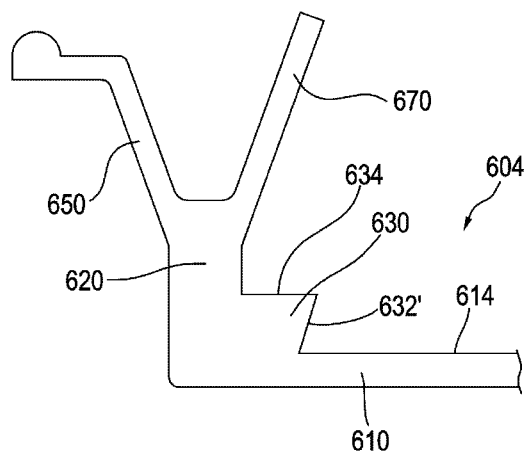
FIG. 29 is a cross-sectional view showing another example of a protruding structure.

FIG. 29 is a cross-sectional view showing another example of a protruding structure 630 with a inclined side face 632'. Like this, the side face 632' of the protruding structure 630 is not necessarily perpendicular to the plate portion 610, and it may be inclined by an angle of 45° to left or right sides with respect to a vertical line. Even though not shown, further, the side face 632' may include a curved face. In the same manner, the top face 634 does not need to be always perpendicular to the perimeter portion 620.

Figure 30:
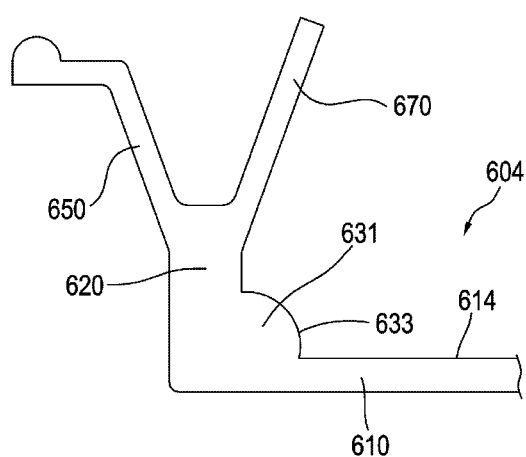
FIG. 30 is a cross-sectional view showing yet another example of a protruding structure.

FIG. 30 is a cross-sectional view showing yet another example of a protruding structure 631. Here, the face 633 of a protruding structure 631 is curved. In this case, it is difficult to distinguish the side and top faces of the protruding structure 631, and accordingly, the shape of the protruding structure 631 can be defined by the single face 633. Further, the height and width of the protruding structure 631 can be defined by the positions where the face 633 of the protruding structure 631 meets the perimeter portion 620 and the plate portion 610, respectively.

Figure 31:
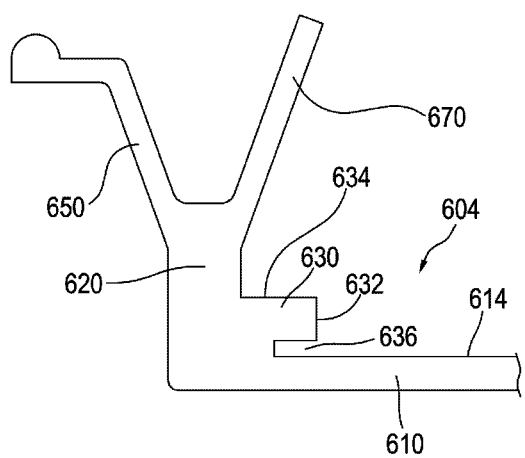
FIG. 31 is a cross-sectional view showing still another example of a protruding structure.

FIG. 31 is a cross-sectional view showing still another example of a protruding structure 630. Here, a groove 636 is formed at the side face 632 along a circumferential direction. If the groove 636 is formed, a ring or a circular plate (not shown) made of metal or plastic can be inserted therein. If a ring or a circular plate with a slightly larger circumference than that of the groove 636 is inserted into the groove 636, the plate portion 610, which may sag, can be tightened. Although only one groove 636 formed on the side face 632 is shown above, one or more grooves or protrusions as uneven structures to support a ring or circular plate may be formed on the side face 632, the top face 634 or on the curved face 633 of FIG. 30.

Figure 32:
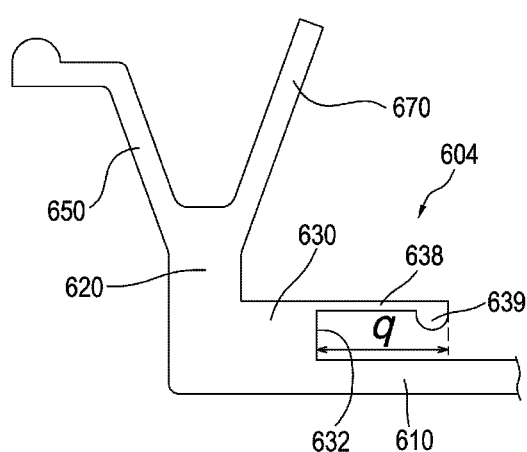
FIG. 32 is a cross-sectional view showing still yet another example of a protruding structure.

FIG. 32 is a cross-sectional view showing still yet another example of a protruding structure 630. Here, the substrate receiving member 604 comprises further a receiving flap 638 extended inwardly from the side face 632 of the protruding structure 630. The receiving flap 638 is preferably made of the same material as the substrate receiving member 604, and can be formed at the same time when the substrate receiving member 604 is made. The receiving flap 638 has a shape of hollow disk, and an extended length q of the receiving flap 638 is in a range of 5 mm to 20 mm, and a thickness thereof is in a range of 0.3 mm to 1 mm. The receiving flap 630 can have an O-ring structure 639 located at the end to achieve a solid securing. The receiving flap 638 serves to receive and fix a circular plate or ring (not shown) therein. Even though not shown, the receiving flap can be extended inwardly from a top face or from a curved face of the protruding structure.

Therefore, with reference to FIG. 26, according to another preferred embodiment of the present invention, the substrate receiving member 604 of the carrier head 900 for a chemical mechanical polishing apparatus comprises: a plate portion 610 having an outer surface 612 for receiving a substrate and an inner surface 614 at the back of the outer surface 612; a perimeter portion 620 extended in a height direction from an edge of the plate portion 610; a securing portion 650 extended from an outer part of the perimeter portion 620; a contact portion 670 extended from an inner part of the perimeter portion 620; and a protruding structure 630 formed at a corner where the perimeter portion 620 and the inner surface 614 meet each other.

Figure 33:
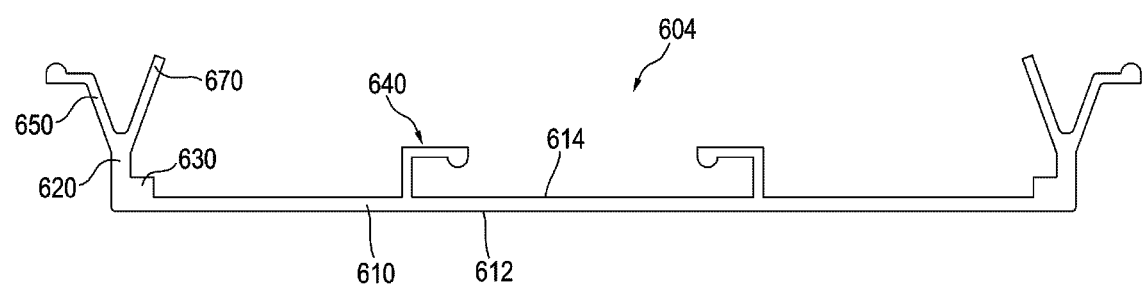
FIG. 33 is a cross-sectional view showing yet another embodiment of substrate receiving member.

FIG. 33 is a cross-sectional view showing yet another embodiment of a substrate receiving member 604. Here, a fixing flap 640 is extended upwardly from the inner surface 614. The fixing flap 640 is preferably made of the same material as the substrate receiving member 604, and can be formed at the same time when the substrate receiving member 604 is made.

Figure 34:
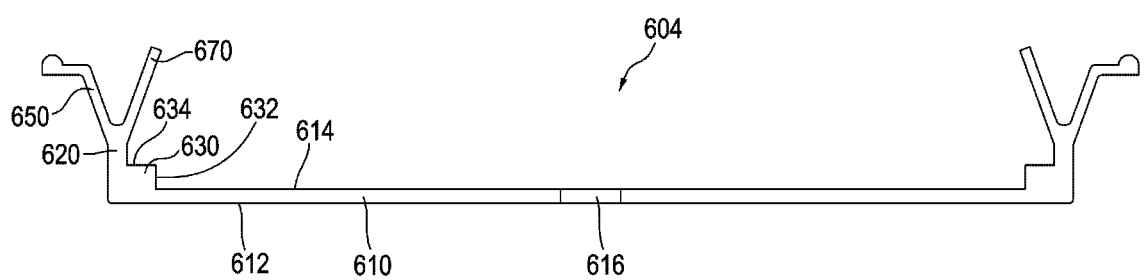
FIG. 34 is a cross-sectional view showing a perforated hole formed at a plate portion of a substrate receiving member.

FIG. 34 is a cross-sectional view showing a perforated hole 616 formed at the plate portion 610 of a substrate receiving member 604. The perforated hole 616 is preferably circular, and can have a diameter of 5 mm to 30 mm. Fluid pressure or vacuum can be applied directly to the substrate (not shown) through the perforated hole 616. Although only one perforated hole 616 at the center of the plate portion 610 is shown in the figure, a plurality of perforated holes having different diameters can be formed at the plate portion 610.

Figure 35:
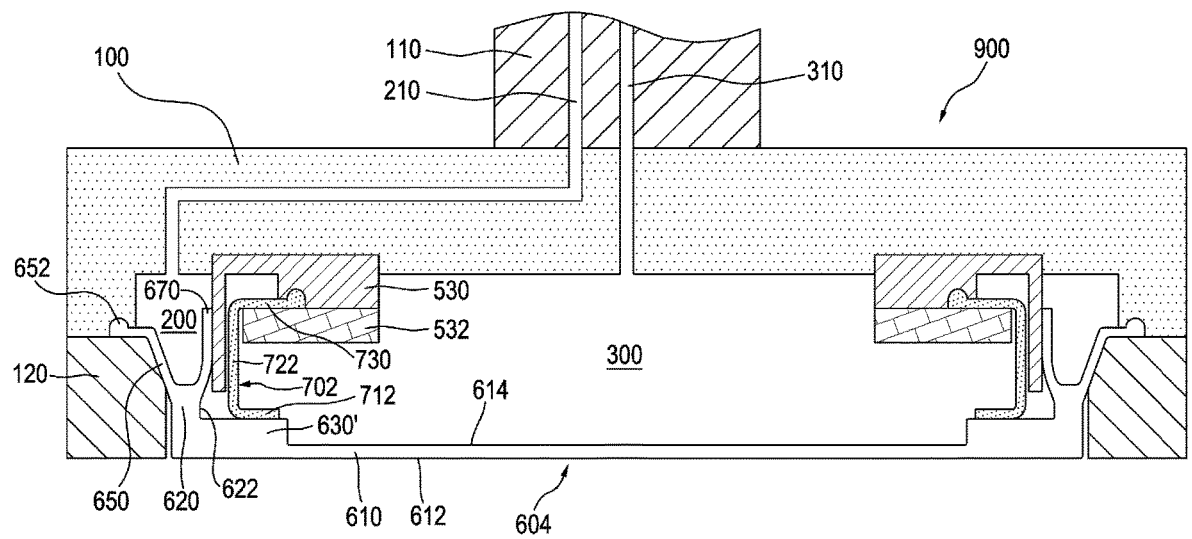
FIG. 35 is a cross-sectional view of a carrier head comprising a substrate receiving member with a protruding structure, and a contact flap.

FIG. 35 is a cross-sectional view of a carrier head 900 comprising a substrate receiving member 604 with a protruding structure 630', and a contact flap 702. As shown, the top portion 730 of the contact flap 702 is connected to the lower part of the base 100 by being fastened between the contact coupling structure 530 and the clamp 532. A side portion 722 is extended downwardly from the top portion 730, and a bottom portion 712 is extended inwardly from a bottom end of the side portion 720. The contact flap 702 is an open structure and positioned adjacently to and inward of the perimeter portion 620. Even when fluid pressure is applied to the plate portion pressurizing chamber 300, fluid flow from the plate portion pressurizing chamber 300 into the perimeter portion pressurizing chamber 200 is prevented through a contact of the side portion 722 to the contact coupling structure 530 and a contact of the bottom portion 712 to the protruding structure 630'.

Figure 36:
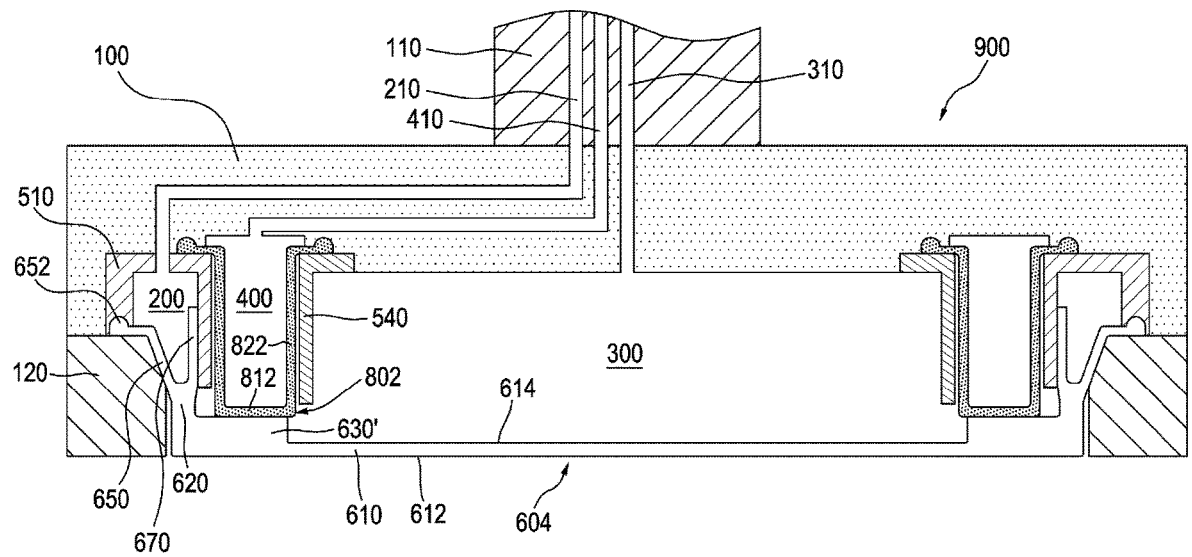
FIG. 36 is a cross-sectional view of a carrier head comprising a substrate receiving member with a protruding structure, and a bladder.

FIG. 36 is a cross-sectional view of a carrier head 900 comprising a substrate receiving member 604 with a protruding structure 630', and a bladder 802. The bladder 802 is positioned adjacent to and inside of the perimeter portion 620 and connected to the lower part of the base 100 by means of the contact coupling structure 510 and the wall structure 540. The bladder 802 is expanded when it is supplied independently with fluid from the fluid passage 410. When expanded, the contact coupling structure 510 limits the expansion of the bladder 800 to an outer direction, and the wall structure 540 limits the expansion of the bladder 800 to an inner direction. Fluid pressure causing this expansion of the bladder 802 is also applied to the protruding structure 630' which is in contact with the bladder 802. Due to the protruding structure 630', the length of a side portion 822 and the width of a bottom portion 812 can be smaller than those of the bladder 800 shown in FIG. 23.

Figure 37:
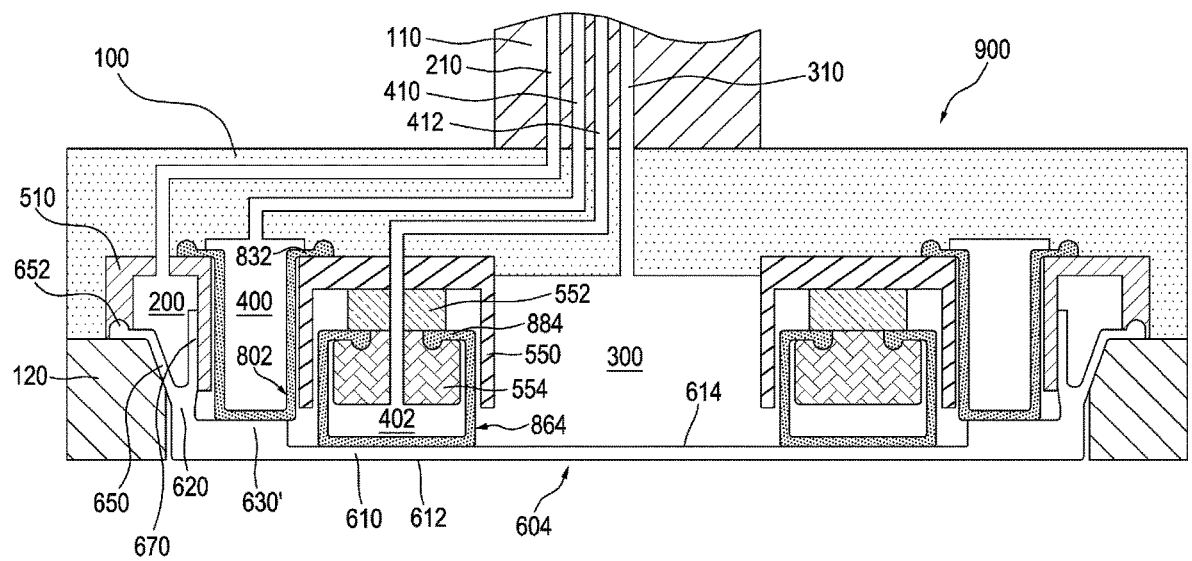
FIG. 37 is a cross-sectional view of a carrier head having both a bladder and a contact flap.

FIG. 37 is a cross-sectional view of a carrier head 900 having both a bladder 802 and a contact flap 760. The contact flap 760 is positioned adjacent to and inside (exterior side but closer to the center of the plate portion 610) of the bladder 802 shown in FIG. 36, and connected to the lower part of the base 100 by securing a top portion 790 between a first flap clamp 560 and a second flap clamp 562. A side portion 780 is extended downwardly from the top portion 790 and a bottom portion 770 is extended inwardly from a bottom end of the side portion 780. The contact flap 760 is an open structure, therefore when fluid pressure is applied to a plate portion pressurizing chamber 300, fluid in the inside of the contact flap 760, that is fluid in the plate portion pressurizing chamber 300, is prevented from flowing to a side of the bladder 802 through a contact of the side portion 780 to the wall structure 540 and a contact of the bottom portion 770 to the plate portion 610.

Figure 38:
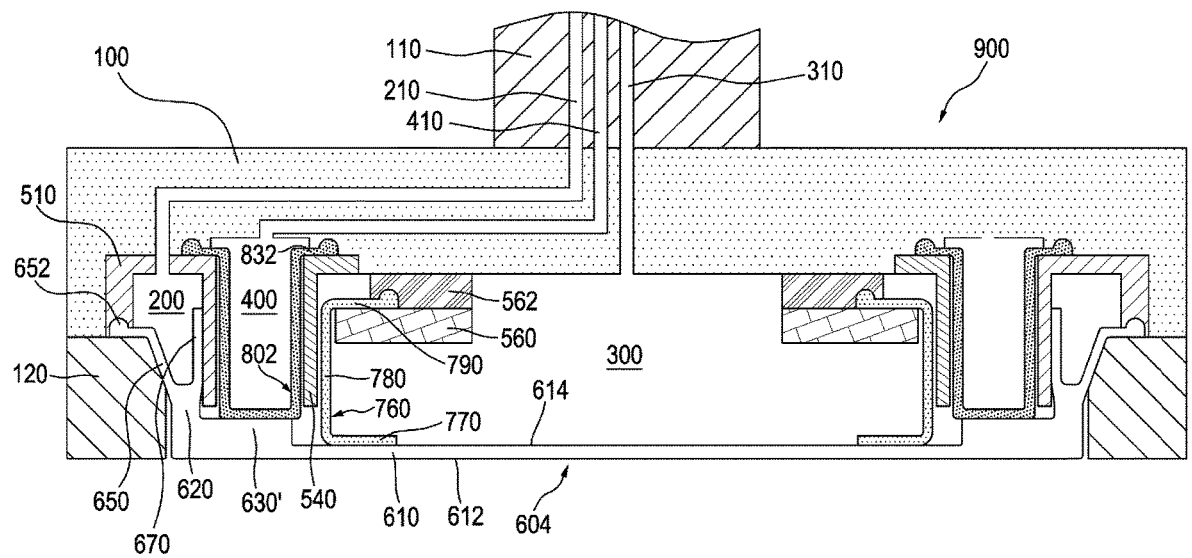
FIG. 38 is a cross-sectional view of a carrier head having a plurality of bladders.

FIG. 38 is a cross-sectional view of a carrier head 900 having a plurality of bladders 802, 864. The bladders 802, 864 are supplied independently with fluid from fluid passages 410, 412 respectively and thus expanded. The first bladder 802 with two fixing portions 830 extended outwardly is positioned adjacent to and inside of the perimeter portion 620, and connected to the lower part of the base 100. When the first bladder 802 is expanded, the contact coupling structure 510 limits an expansion to an outer direction, and a wall structure 550 limits an expansion to an inner direction. Fluid pressure causing this expansion is also applied to the protruding structure 630' in contact with the first bladder 802. Next, the second bladder 864 with two fixing portions 884 extended inwardly is positioned adjacent to and inside of the first bladder 802, and connected to the lower part of the base 100. Since expansions to outer and inner directions of the second bladder 864 are limited by the wall structure 550, the second bladder 864 applies a pressure to a predetermined area of the plate portion 610 through a contact.

MODE FOR INVENTION

The preferred embodiments of the present invention have been sufficiently explained in the description for the best mode for the invention, and accordingly, an explanation on them will be avoided for the brevity of the description.

INDUSTRIAL APPLICABILITY

The carrier head for a chemical mechanical polishing apparatus comprising substrate receiving member according to the present invention is applicable to chemical mechanical polishing process required to fabricate semiconductor or glass substrates, and integrated circuits.

What is claimed is:

1. A carrier head for a chemical mechanical polishing apparatus, comprising:
a base;
a substrate receiving member comprising a plate portion having an outer surface for receiving a substrate and an inner surface at the back of the outer surface, a perimeter portion extended in a height direction from an edge of the plate portion, a securing portion continuously extended from an outer part of the perimeter portion and connected to a lower part of the base, and a contact portion continuously extended from an inner part of the perimeter portion;
a contact coupling structure connected to the lower part of the base to provide a contact surface to the contact portion; and
a perimeter portion pressurizing chamber formed by taking the securing portion and the contact portion as chamber walls when the contact portion contacts firmly the contact coupling structure by means of fluid pressure,
wherein fluid in the perimeter portion pressurizing chamber is prevented from flowing to an inner side surface of the perimeter portion when fluid pressure in the perimeter portion pressurizing chamber is higher than fluid pressure acting on the inner side surface of the perimeter portion, but fluid acting on the inner side surface of the perimeter portion is allowed to flow into the perimeter portion pressurizing chamber when fluid pressure acting on the inner side surface of the perimeter portion is higher than fluid pressure in the perimeter portion pressurizing chamber.

2. The carrier head according to claim 1, further comprising a contact flap having a top portion connected to the lower part of the base, a side portion extended downwardly from the top portion, and a bottom portion extended inwardly from a bottom end of the side portion, the contact flap being an open structure and positioned adjacent to and inward of the perimeter portion, and thereby configured to prevent fluid flow from an inside of the contact flap into the perimeter portion pressurizing chamber through a contact of the side portion with the contact coupling structure and a contact of the bottom portion with the plate portion.

3. The carrier head according to claim 1, further comprising a bladder connected to the lower part of the base and positioned adjacent to and inward of the perimeter portion, the bladder being configured to be independently supplied with fluid and apply pressure through a contact to a predetermined area of the plate portion by an expansion thereof, the expansion being limited outwardly by the contact coupling structure and inwardly by a wall structure connected to the base.

4. The carrier head according to claim 3, further comprising a contact flap having a top portion connected to the lower part of the base, a side portion extended downwardly from the top portion, and a bottom portion extended inwardly from a bottom end of the side portion, the contact flap being an open structure and positioned adjacent to and inward of the bladder, and thereby configured to prevent fluid flow from an inside of the contact flap to a side of the bladder through a contact of the side portion with the wall structure and a contact of the bottom portion with the plate portion.

5. A carrier head for a chemical mechanical polishing apparatus, comprising:
a base;
a substrate receiving member comprising a plate portion having an outer surface for receiving a substrate and an inner surface at the back of the outer surface, a perimeter portion extended in a height direction from an edge of the plate portion, a securing portion continuously extended from an outer part of the perimeter portion and connected to a lower part of the base, a contact portion continuously extended from an inner part of the perimeter portion, and a protruding structure formed at a corner where the perimeter portion and the inner surface meet each other;
a contact coupling structure connected to the lower part of the base to provide a contact surface to the contact portion; and
a perimeter portion pressurizing chamber formed by taking the securing portion and the contact portion as chamber walls when the contact portion contacts firmly the contact coupling structure by means of fluid pressure,
wherein fluid in the perimeter portion pressurizing chamber is prevented from flowing to an inner side surface of the perimeter portion when fluid pressure in the perimeter portion pressurizing chamber is higher than fluid pressure acting on the inner side surface of the perimeter portion, but fluid acting on the inner side surface of the perimeter portion is allowed to flow into the perimeter portion pressurizing chamber when fluid pressure acting on the inner side surface of the perimeter portion is higher than fluid pressure in the perimeter portion pressurizing chamber.

6. The carrier head according to claim 5, further comprising a contact flap having a top portion connected to the lower part of the base, a side portion extended downwardly from the top portion, and a bottom portion extended inwardly from a bottom end of the side portion, the contact flap being an open structure and positioned adjacent to and inward of the perimeter portion, and thereby configured to prevent fluid flow from an inside of the contact flap into the perimeter portion pressurizing chamber through a contact of the side portion with the contact coupling structure and a contact of the bottom portion with the protruding structure.

7. The carrier head according to claim 5, further comprising a bladder connected to the lower part of the base and positioned adjacent to and inward of the perimeter portion, the bladder being configured to be independently supplied with fluid and apply pressure through a contact to the protruding structure by an expansion thereof, the expansion being limited outwardly by the contact coupling structure and inwardly by a wall structure connected to the base.

8. The carrier head according to claim 7, further comprising a contact flap having a top portion connected to the lower part of the base, a side portion extended downwardly from the top portion, and a bottom portion extended inwardly from a bottom end of the side portion, the contact flap being an open structure and positioned adjacent to and inward of the bladder, and thereby configured to prevent fluid flow from an inside of the contact flap to a side of the bladder through a contact of the side portion with the wall structure and a contact of the bottom portion with the plate portion.

9. The carrier head according to claim 5, further comprising:
a first bladder connected to the lower part of the base and positioned adjacent to and inward of the perimeter portion, the first bladder being configured to be independently supplied with fluid and apply pressure through a contact to the protruding structure by an expansion thereof, the expansion being limited outwardly by the contact coupling structure and inwardly by a wall structure connected to the base; and a second bladder connected to the lower part of the base and positioned adjacent to and inward of the first bladder, the second bladder being configured to be independently supplied with fluid and apply pressure through a contact to a predetermined area of the plate portion by an expansion thereof, the expansion being limited outwardly and inwardly by the wall structure.

10. A substrate receiving member of a carrier head with a contact coupling structure for a chemical mechanical polishing apparatus, comprising:

a plate portion having an outer surface for receiving a substrate and an inner surface at the back of the outer surface;

a perimeter portion extended in a height direction from an edge of the plate portion;

a securing portion continuously extended from an outer part of the perimeter portion; and a contact portion continuously extended from an inner part of the perimeter portion and configured to contact the contact coupling structure.

11. The substrate receiving member according to claim 10, wherein an end part of the contact portion points toward an upper-inner direction for a solid contact with the contact coupling structure.

12. The substrate receiving member according to claim 11, wherein the upper-inner direction is inclined at an angle from 2° to 45° with respect to a vertical direction.

13. The substrate receiving member according to claim 10, wherein the contact portion comprises a substantially vertical guide portion connected to the inner part of the perimeter portion and a firm contact portion extended in an upper-inner direction from the guide portion, an end of the firm contact portion being located higher than a position of the guide portion from which the firm contact portion is extended.

14. The substrate receiving member according to claim 10, further comprising a receiving flap extended inwardly from an inner side surface of the perimeter portion.

15. The substrate receiving member according to claim 10, further comprising a protruding structure formed at a corner where the perimeter portion and the inner surface meet each other.

16. The substrate receiving member according to claim 15, wherein the protruding structure is configured to disperse a pressure applied to the perimeter portion.

17. The substrate receiving member according to claim 15, wherein the protruding structure has a height in a range of 3 mm to 15 mm and a width in a range of 4 mm to 20 mm.

18. The substrate receiving member according to claim 15, wherein the protruding structure has a step shape.

19. The substrate receiving member according to claim 15, wherein the protruding structure has at least one groove formed at a surface thereof along a circumferential direction.

20. The substrate receiving member according to claim 15, further comprising a receiving flap extended inwardly from a surface of the protruding structure.

21. The substrate receiving member according to claim 15, wherein the plate portion has at least one perforated hole formed thereat.

22. The substrate receiving member according to claim 15, further comprising at least one fixing flap extended upwardly from the inner surface of the plate portion.

* * * * *